United States Patent
Ota et al.

(10) Patent No.: US 8,202,809 B2
(45) Date of Patent: Jun. 19, 2012

(54) METHOD OF MANUFACTURING SEMICONDUCTOR DEVICE, METHOD OF PROCESSING SUBSTRATE, AND SUBSTRATE PROCESSING APPARATUS

(75) Inventors: Yosuke Ota, Toyama (JP); Naonori Akae, Toyama (JP); Yushin Takasawa, Toyama (JP); Yoshiro Hirose, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/950,340

(22) Filed: Nov. 19, 2010

(65) Prior Publication Data
US 2011/0124204 A1    May 26, 2011

(30) Foreign Application Priority Data

Nov. 20, 2009 (JP) .................. 2009-265431
Oct. 1, 2010 (JP) .................. 2010-223492

(51) Int. Cl.
*H01L 21/31* (2006.01)
*H01L 21/469* (2006.01)
*C23C 16/00* (2006.01)

(52) U.S. Cl. .................. 438/788; 427/255.28
(58) Field of Classification Search .................. None
See application file for complete search history.

(56) References Cited

U.S. PATENT DOCUMENTS

2006/0105583 A1* 5/2006 Ikeda et al. .................. 438/788
2009/0232985 A1* 9/2009 Dussarrat et al. ........ 427/255.28

FOREIGN PATENT DOCUMENTS

JP   2006-054432 A   2/2006
JP   2006-190787 A   7/2006

* cited by examiner

*Primary Examiner* — Ha Tran T Nguyen
*Assistant Examiner* — Valerie N Brown
(74) *Attorney, Agent, or Firm* — Volpe and Koenig, P.C.

(57) ABSTRACT

A semiconductor device manufacturing method includes: forming a layer on a heated substrate by supplying source gas into a process vessel; changing the layer into an oxide layer by supplying gases containing oxygen and hydrogen to the heated substrate in the process vessel under a pressure lower than atmospheric pressure; and forming an oxide film on the heated substrate by alternately repeating the forming of the layer and the changing of the layer while purging an inside of the process vessel therebetween. In the forming of the layer, the source gas is supplied toward the substrate through a nozzle at a side of the substrate, and inert or hydrogen-containing gas is supplied together with the source gas through the nozzle toward the substrate, such that the velocity of the source gas flowing parallel to the substrate is greater than the velocity of the inert gas flowing parallel to the substrate in the purging of the process vessel.

16 Claims, 11 Drawing Sheets

WHEN FLOW VELOCITY OF HCD IS HIGH

METHOD OF MANUFACTURING SEMICONDUCTOR DEVICE, METHOD OF PROCESSING SUBSTRATE, AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2009-265431, filed on Nov. 20, 2009, and No. 2010-223492, filed on Oct. 1, 2010, in the Japanese Patent Office, the entire contents of which are hereby incorporated by reference.

BACKGROUND OF THE INVENTION

1. Field of the Invention

The present invention relates to a method of manufacturing a semiconductor device and a method of processing a substrate, the methods including a process of forming a thin film on a substrate, and a substrate processing apparatus suitable for the process.

2. Description of the Related Art

A flash memory includes an electron accumulation region (floating gate) surrounded by an insulating film and operates in a manner that information is written in the flash memory by electron exchange through a thin tunnel oxide film and the stored information is retained for a long time by holding electrons using the insulating capacity of the thin tunnel oxide layer. Such a flash memory is required to retain the stored information for a long time, for example, even 10 years, without requiring any external operation, and thus stricter requirements are imposed on an insulating film surrounding a charge accumulation region which is called a floating gate. A stacked structure of oxide film (SiO2)/nitride film (Si3N4)/oxide film (SiO2), which is generally called "ONO" structure, is used as an interlayer insulating film between a floating gate and a control gate configured to control the operation of a memory cell, and it is expected that the ONO structure has low leak current characteristics.

In the related art, a $SiO_2$ insulating film of an ONO stacked structure is formed by, for example, a chemical vapor deposition (CVD) method using $SiH_2Cl_2$ gas and $N_2O$ gas at a high temperature of about 800° C. (for example, refer to Patent Document 1). However, as devices become finer and highly integrated, there arise problems such as deterioration of step coverage characteristics and dependence of a film thickness on pattern density difference, and thus it is necessary to solve such problems.

In addition, a film-forming method for a flash memory is required to have improved productivity and change into a CVD method using $SiH_2Cl_2$ gas and $N_2O$ gas for high productivity.

[Patent Document 1] Japanese Unexamined Patent Application Publication No. 2001-85333

When a $SiO_2$ insulating film is formed, more amounts of atoms other than silicon (Si) and oxygen (O) included in a source used to form the $SiO_2$ insulating film may remain in the $SiO_2$ insulating film as impurities if the film-forming temperature is reduced. For this reason, if a $SiO_2$ insulating film is formed by using an organic source gas, atoms such as carbon (C), hydrogen (H), and nitrogen (N) included in molecules of the organic source gas may remain in the $SiO_2$ insulating film as impurities. In addition, although an inorganic source gas is used, atoms such as hydrogen (H) and chlorine (Cl) included in the inorganic source gas may remain in the film as impurities. Since such impurities lower the quality of an insulting film significantly, it is necessary to improve the quality of the insulating film, for example, by increasing the formation temperature of the insulating film. However, if the formation temperature is increased, since the thickness uniformity of the insulating film is significantly decreased, it is difficult to apply this temperature increasing method to production.

SUMMARY OF THE INVENTION

An object of the present invention is to provide a method of manufacturing a semiconductor device, a method of process a substrate, and a substrate processing apparatus, which are designed to form an insulating film having good thickness uniformity and very low impurity concentrations in a high temperature region.

According to an aspect of the present invention, there is provided a method of manufacturing a semiconductor device, including:

(a) supplying a source gas containing a predetermined element to a heated substrate in a process vessel to form a layer containing the predetermined element on the substrate;

(b) supplying an oxygen-containing gas and a hydrogen-containing gas to the heated substrate in the process vessel to change the layer containing the predetermined element into an oxide layer wherein a pressure of an inside of the process vessel is lower than an atmospheric pressure;

(c) supplying an inert gas into the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

According to another aspect of the present invention, there is provided a method of processing a substrate, including:

(a) supplying a source gas containing a predetermined element to a heated substrate in a process vessel heated substrate in a process vessel to form a layer containing the predetermined element on the substrate;

(b) supplying an oxygen-containing gas and a hydrogen-containing gas to the heated substrate in the process vessel to change the layer containing the predetermined element into an oxide layer, wherein a pressure of an inside of the process vessel is lower than an atmospheric pressure;

(c) supplying an inert gas into the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

According to another aspect of the present invention, there is provided a substrate processing apparatus including:

a process vessel configured to accommodate a substrate;

a heater configured to heat a substrate in the process vessel;

a source gas supply system configured to supply a source gas containing a predetermined element into the process vessel;

an oxygen-containing gas supply system configured to supply an oxygen-containing gas into the process vessel;

a hydrogen-containing gas supply system configured to supply a hydrogen-containing gas into the process vessel;

an inert gas supply system configured to supply an inert gas into the process vessel;

a pressure regulator configured to control pressure of the inside of the process vessel; and a controller configured to control the source gas supply system, the oxygen-containing gas supply system, the hydrogen-containing gas supply system, the inert gas supply system, pressure regulator, and the heater so as to perform:

(a) supplying the source gas to a heated substrate in the process vessel to form a layer containing the predetermined element on the substrate;

(b) supplying the oxygen-containing gas and the hydrogen-containing gas to the heated substrate in the process vessel to change the layer containing the predetermined element into an oxide layer, wherein a pressure of an inside of the process vessel is lower than an atmospheric pressure;

(c) supplying the inert gas into the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

DETAILED DESCRIPTION OF THE PREFERRED EMBODIMENTS

Figure 1:
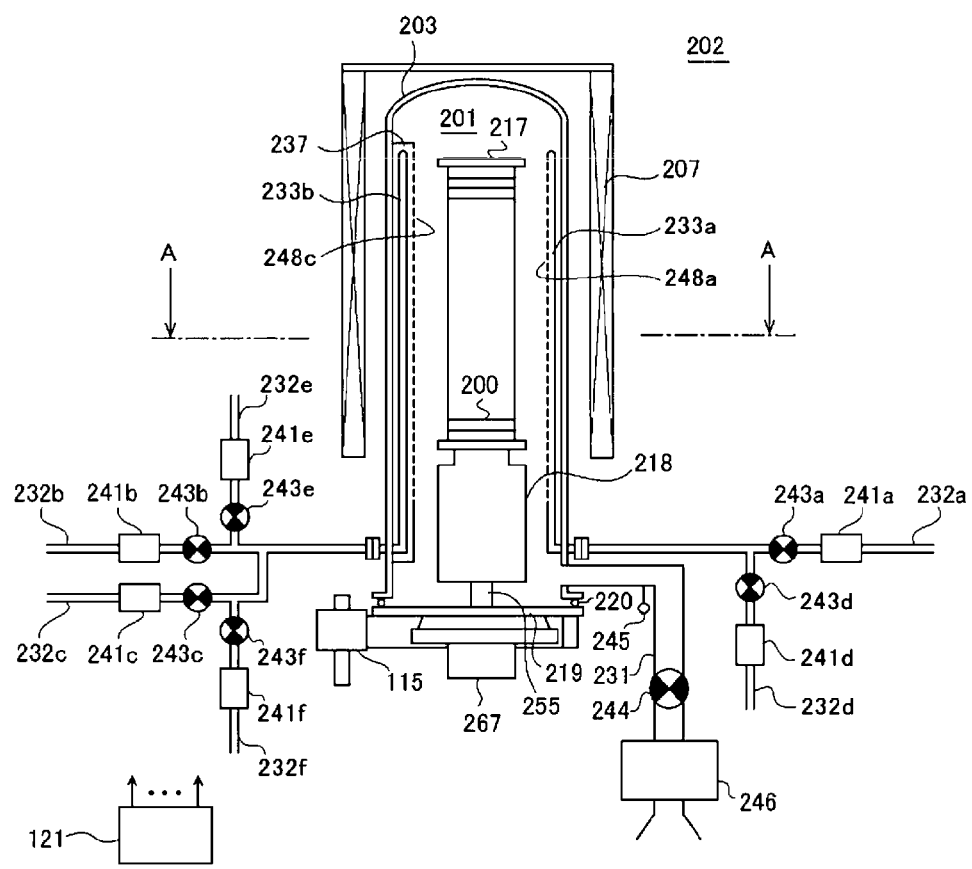
FIG. 1 is a schematic view illustrating a vertical process furnace of a substrate processing apparatus that can be suitably used according to an embodiment of the present invention, FIG. 1 illustrating a vertical sectional view of the process furnace.

The inventors have studied a method of forming an insulating film in a high temperature region. As a result, it has been found that an insulating film having very low impurity concentrations and good thickness uniformity can be formed in a high temperature region as follows. An oxide film having a predetermined thickness is formed on a substrate by alternately repeating: a process of forming a layer containing a predetermined element on the substrate by supplying a source gas containing the predetermined element to an inside of a process vessel which accommodates the substrate and is heated and kept at a pressure lower than atmospheric pressure and exhausting the source gas from the process vessel; and a process of changing the layer containing the predetermined element into an oxide layer by supplying an oxygen-containing gas and a hydrogen-containing gas into the process vessel which is heated and kept at a pressure lower than atmospheric pressure and exhausting the oxygen-containing gas and the hydrogen-containing gas from the process vessel, while performing a process of purging the inside of the process vessel by supplying an inert gas into the process vessel and exhausting the inert gas from the process vessel between the process of forming the layer containing the predetermined element and the process of changing of the layer containing the predetermined element into the oxide layer. In the process of forming the layer containing the predetermined element, the source gas is supplied toward the substrate through a nozzle disposed at a side of the substrate, and an inert gas or an hydrogen-containing gas is supplied together with the source gas through the nozzle toward the substrate, so that the flow velocity of the source gas flowing parallel to a surface of the substrate can be greater than the flow velocity of the inert gas flowing parallel to the surface of the substrate in the process of purging the inside of the process vessel.

The process of forming the layer containing the predetermined element is performed under a condition where a CVD reaction is caused. At this time, a predetermined element layer is formed as the layer containing the predetermined element constituted by less than one atomic layer to several atomic layers. The layer containing the predetermined element may be an adsorption layer of the source gas containing the predetermined element (hereinafter simply referred to as a source gas). The predetermined element layer is a general term used to denote a layer made of the predetermined element, such as a continuous layer, a discontinuous layer, and a thin film in which such layers are overlapped. In addition, a continuous layer made of the predetermined element may also be called "a thin film." In addition, the adsorption layer of the source gas is a term including a continuous layer formed by chemical adsorption of molecules of the source gas and a discontinuous layer formed by chemical adsorption of molecules of the source gas. Furthermore, the expression "a layer less than one atomic layer" is used to denote a discontinuous atomic layer. In a condition where the source gas decomposes by itself, the predetermined element layer is formed on the substrate by deposition of the predetermined element on the substrate. In a condition where the source gas does not decompose by itself, a source gas adsorption layer is formed on the substrate by adsorption of the source gas on the substrate. The former case where the predetermined element layer is formed on the substrate is more preferable than the latter case where the source gas adsorption layer is formed on the substrate because the film-forming rate of the former case is higher than that of the latter case.

Furthermore, the process of changing the layer containing the predetermined element into the oxide layer is performed by generating an oxidizing species containing oxygen by reaction between the oxygen-containing gas and the hydrogen-containing gas in the process vessel which is heated and kept at a pressure lower than atmospheric pressure and oxidizing (changing) the layer containing the predetermined element into the oxide layer by using the oxidizing species. By this oxidizing treatment, oxidizing power can be largely increased as compared with the case where only an oxygen-containing gas is supplied. That is, by adding a hydrogen-containing gas to an oxygen-containing gas under a depressurized atmosphere, oxidizing power can be largely increased as compared with the case where only an oxygen-containing gas is supplied. The process of changing the layer containing the predetermined element into the oxide layer can be performed under a depressurized atmosphere without using plasma. Alternatively, in the process of changing the layer containing the predetermined element into the oxide layer, one or both of the oxygen-containing gas and the hydrogen-containing gas may be activated by plasma.

In the process of forming the layer containing the predetermined element, the source gas is supplied toward the substrate through the nozzle disposed at a side of the substrate, and the inert gas or the hydrogen-containing gas is supplied together with the source gas through the nozzle toward the substrate, so that the flow velocity of the source gas flowing parallel to the surface of the substrate can be greater than the flow velocity of the inert gas flowing parallel to the surface of the substrate in the process of purging the process vessel. In this way, by increasing the flow velocity of the source gas flowing parallel to the surface of the substrate, the layer containing the predetermined element can be formed while inhibiting (suppressing) deposition and/or adsorption of the layer containing the predetermined element, and the center of the deposition and/or adsorption of the layer containing the predetermined element can be moved closer to the center of the substrate from an edge side of the substrate. In addition, the thickness difference between the thickest part and the thinnest part of the layer containing the predetermined can be reduced. From this, it can be understood that an insulating film having good thickness uniformity can be formed in a high temperature region.

The present invention is provided based on the knowledge of the inventors. Hereinafter, an embodiment of the present invention will now be described with reference to the attached drawings.

Figure 2:
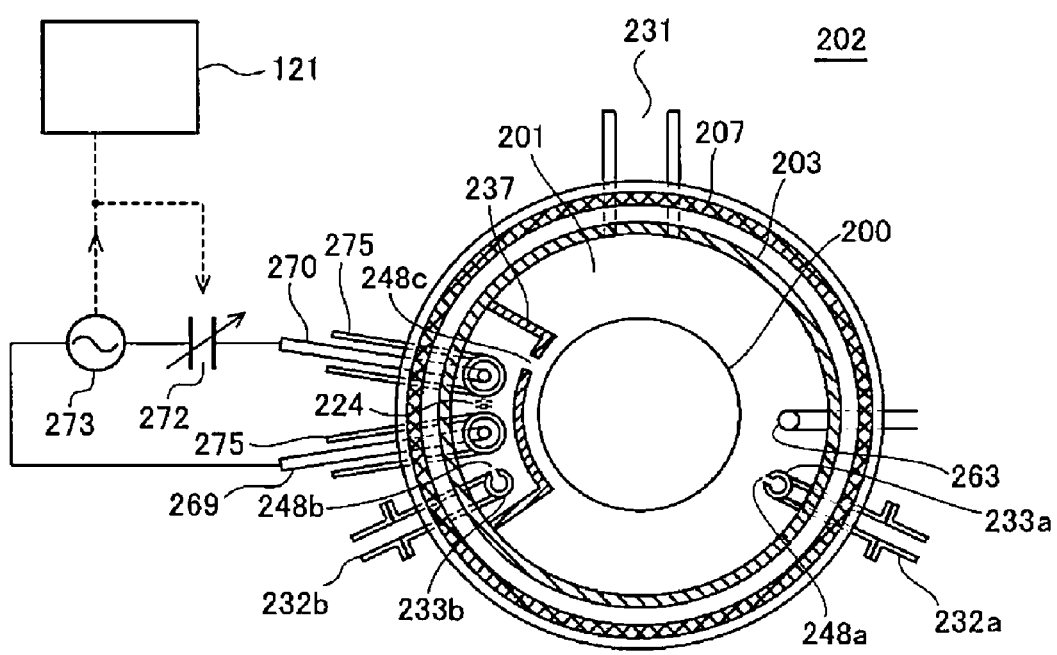
FIG. 2 is a sectional view taken along line A-A of FIG. 1 for schematically illustrating the vertical process furnace according to the embodiment of the present invention.

FIG. 1 is a schematic view illustrating a vertical process furnace 202 of a substrate processing apparatus that can be suitably used according to an embodiment of the present invention, FIG. 1 illustrating a vertical sectional view of the process furnace 202. FIG. 2 is a sectional view taken along line A-A of FIG. 1 for schematically illustrating the vertical process furnace 202 according to the embodiment of the present invention. However, the present invention is not limited to the substrate processing apparatus of the current embodiment. For example, the present invention can be applied to other substrate processing apparatuses such as a substrate processing apparatus having a single-wafer type, hot wall type, or cold wall type process furnace.

As shown in FIG. 1, the process furnace 202 includes a heater 207 as a heating unit (heating mechanism). The heater 207 has a cylindrical shape and is vertically disposed in a state where the heater 207 is supported on a heater base (not shown) which is a holding plate. As described later, the heater 207 is also used as an activation mechanism for activating gas by heat.

Inside the heater 207, a reaction tube 203 constituting a reaction vessel (process vessel) is disposed concentrically with the heater 207. The reaction tube 203 is made of a heat-resistant material such as a quartz ($SiO_2$) or silicon carbide (SiC) and has a cylindrical shape with a closed top side and an opened bottom side. The hollow part of the reaction tube 203 forms a process chamber 201 and is configured to accommodate substrates such as wafers 200 by using a boat 217 (described later) in a manner that the wafers 200 are horizontally positioned and vertically arranged in multiple stages.

At the lower part of the reaction tube 203 in the process chamber 201, a first nozzle 233a as a first gas introducing part, and a second nozzle 233b as a second gas introducing part are disposed through the reaction tube 203. A first gas supply pipe 232a and a second gas supply pipe 232b are connected to the first nozzle 233a and the second nozzle 233b, respectively. In addition, a third gas supply pipe 232c is connected to the second gas supply pipe 232b. In this way, at the reaction tube 203, two nozzles 233a and 233b, and three gas supply pipes 232a, 232b, and 232c are disposed, and it is configured such that a plurality of kinds of gases, here, three kinds of gases, can be supplied into the process chamber 201.

At the first gas supply pipe 232a, a flow rate controller (flow rate control unit) such as a mass flow controller (MFC) 241a, and an on-off valve such as a valve 243a are sequentially disposed from the upstream side of the first gas supply pipe 232a. In addition, a first inert gas supply pipe 232d is connected to the downstream side of the valve 243a of the first gas supply pipe 232a. At the first inert gas supply pipe 232d, a flow rate controller (flow rate control unit) such as a mass flow controller 241d, and an on-off valve such as a valve 243d are sequentially disposed from the upstream side of the first inert gas supply pipe 232d. In addition, the first nozzle 233a is connected to the tip of the first gas supply pipe 232a. In an arc-shaped space between the inner wall of the reaction tube 203 and the wafers 200, the first nozzle 233a is erected in a manner that the first nozzle 233a extends upward from the lower side to the upper side along the inner wall of the reaction tube 203 in a direction in which the wafers 200 are stacked. That is, the first nozzle 233a is disposed at a side of a wafer arrangement region where wafers 200 are arranged. The first nozzle 233a is an L-shaped long nozzle. Gas supply holes 248a are formed through the lateral surface of the first nozzle 233a. The gas supply holes 248a are formed toward the centerline of the reaction tube 203 so that gas can be supplied toward the wafers 200 through the gas supply holes 248a. The gas supply holes 248a are formed at a plurality of positions along the lower side to the upper side of the reaction tube 203, and the gas supply holes 248a have the same size and are arranged at the same pitch.

A first gas supply system is constituted mainly by the first gas supply pipe 232a, the mass flow controller 241a, and the valve 243a. The first nozzle 233a may be included in the first gas supply system. In addition, a first inert gas supply system is constituted mainly by the first inert gas supply pipe 232d, the mass flow controller 241d, and the valve 243d. The first inert gas supply system functions as a purge gas supply system.

At the second gas supply pipe 232b, a flow rate controller (flow rate control unit) such as a mass flow controller (MFC) 241b, and an on-off valve such as a valve 243b are sequentially disposed from the upstream side of the second gas supply pipe 232b. In addition, a second inert gas supply pipe 232e is connected to the downstream side of the valve 243b of the second gas supply pipe 232b. At the second inert gas supply pipe 232e, a flow rate controller (flow rate control unit) such as a mass flow controller 241e, and an on-off valve such as a valve 243e are sequentially disposed from the upstream side of the second inert gas supply pipe 232e. In addition, the second nozzle 233b is connected to the tip of the second gas supply pipe 232b. The second nozzle 233b is disposed in a buffer chamber 237 forming a gas diffusion space.

The buffer chamber 237 is disposed in an arc-shaped space between the reaction tube 203 and the wafers 200 in a manner that the buffer chamber 237 is located from the lower side to the upper side of the inner wall of the reaction tube 203 in the direction in which the wafers 200 are stacked. That is, the buffer chamber 237 is disposed at a side of the wafer arrangement region. At an end of a wall of the buffer chamber 237 adjacent to the wafers 200, gas supply holes 248c are formed to supply gas therethrough. The gas supply holes 248c are formed toward the centerline of the reaction tube 203 so that gas can be supplied toward the wafers 200 through the gas supply holes 248c. The gas supply holes 248c are formed at a plurality of positions along the lower side to the upper side of the reaction tube 203, and the gas supply holes 248c have the same size and are arranged at the same pitch.

The second nozzle 233b is disposed in the buffer chamber 237 at an end opposite to the end where the gas supply holes 248c are formed, in a manner that the second nozzle 233b is erected upward along the lower side to the upper side of the inner wall of the reaction tube 203 in the direction in which the wafers 200 are stacked. That is, the second nozzle 233b is disposed at a side of the wafer arrangement region. The second nozzle 233b is an L-shaped long nozzle. Gas supply holes 248b are formed through the lateral surface of the second nozzle 233b. The gas supply holes 248b are opened toward the centerline of the buffer chamber 237. Like the gas supply holes 248c of the buffer chamber 237, the gas supply holes 248b are formed at a plurality of positions along the lower side to the upper side of the reaction tube 203. If there is a small pressure difference between the inside of the buffer chamber 237 and the inside of the process chamber 201, it may be configured such that the gas supply holes 248b have the same size and are arranged at the same pitch from the upstream side (lower side) to the downstream side (upper side); however if the pressure difference is large, it may be configured such that the size of the gas supply holes 248b increases or the pitch of the gas supply holes 248b decreases as it goes from the upstream side to the downstream side.

In the current embodiment, since the size or pitch of the gas supply holes 248b of the second nozzle 233b is adjusted from the upstream side to the downstream side as described above, although the velocities of gas streams injected through the gas supply holes 248b are different, the flow rates of the gas streams injected through the gas supply holes 248b can be approximately equal. Gas streams injected through the respective gas supply holes 248b are first introduced into the buffer chamber 237 so as to reduce the velocity difference of the gas streams. That is, gas injected into the buffer chamber 237 through the gas supply holes 248b of the second nozzle 233b is reduced in particle velocity and is then injected from the buffer chamber 237 to the inside of the process chamber 201 through the gas supply holes 248c of the buffer chamber 237. Owing to this structure, when gas injected into the buffer chamber 237 through the gas supply holes 248b of the second nozzle 233b is injected into the process chamber 201 through the gas supply holes 248c of the buffer chamber 237, the flow rate and velocity of the gas can be uniform.

A second gas supply system is constituted mainly by the second gas supply pipe 232b, the mass flow controller 241b, and the valve 243b. The second nozzle 233b and the buffer chamber 237 may be included in the second gas supply system. In addition, a second inert gas supply system is constituted mainly by the second inert gas supply pipe 232e, the mass flow controller 241e, and the valve 243e. The second inert gas supply system functions as a purge gas supply system.

At the third gas supply pipe 232c, a flow rate controller (flow rate control unit) such as a mass flow controller (MFC) 241c, and an on-off valve such as a valve 243c are sequentially disposed from the upstream side of the third gas supply pipe 232c. In addition, a third inert gas supply pipe 232f is connected to the downstream side of the valve 243c of the third gas supply pipe 232c. At the third inert gas supply pipe 232f, a flow rate controller (flow rate control unit) such as a mass flow controller 241f, and an on-off valve such as a valve 243f are sequentially disposed from the upstream side of the third inert gas supply pipe 232f. In addition, the tip of the third gas supply pipe 232c is connected to the downstream side of the valve 243b of the second gas supply pipe 232b.

A third gas supply system is constituted mainly by the third gas supply pipe 232c, the mass flow controller 241c, and the valve 243c. A part of the second nozzle 233b and the buffer chamber 237 that are located at the downstream side of a junction part between the second gas supply pipe 232b and the third gas supply pipe 232c may be included in the third gas supply system. In addition, a third inert gas supply system is constituted mainly by the third inert gas supply pipe 232f, the mass flow controller 241f, and the valve 243f. The third inert gas supply system functions as a purge gas supply system.

A source gas containing a predetermined element, that is, a source gas containing silicon (Si) as the predetermined element (silicon-containing gas) such as hexachlorodisilane ($Si_2Cl_6$, abbreviation: HCD) is supplied from the first gas supply pipe 232a into the process chamber 201 through the mass flow controller 241a, the valve 243a, and the first nozzle 233a. That is, the first gas supply system is configured as a source gas supply system (silicon-containing gas supply system). At this time, inert gas is supplied as a deposition/adsorption inhibition gas from the first inert gas supply pipe 232d into the first gas supply pipe 232a through the mass flow controller 241d and the valve 243d. Herein, the deposition/adsorption inhibition gas is used to inhibit deposition of silicon or adsorption of HCD gas on surfaces of the wafers 200. The inert gas supplied into the first gas supply pipe 232a as a deposition/adsorption inhibition gas is supplied together with the HCD gas into the process chamber 201 through the first nozzle 233a. At this time, a hydrogen-containing gas may be supplied into the first gas supply pipe 232a as a deposition/adsorption inhibition gas instead of supplying inert gas. In this case, the first inert gas supply system may be replaced with a hydrogen-containing gas supply system. That is, in this case, a hydrogen-containing gas supply system may be constituted by a hydrogen-containing gas supply pipe 232d, the mass flow controller 241d, and the valve 243d. In this way, the first inert gas supply system may be configured as a deposition/adsorption inhibition gas supply system and replaced with a hydrogen-containing gas supply system.

Gas containing oxygen (oxygen-containing gas) such as oxygen ($O_2$) gas is supplied from the second gas supply pipe 232b into the process chamber 201 through the mass flow controller 241b, the valve 243b, the second nozzle 233b, and the buffer chamber 237. That is, the second gas supply system is configured as an oxygen-containing gas supply system. At this time, inert gas may be supplied from the second inert gas supply pipe 232e into the second gas supply pipe 232b through the mass flow controller 241e and the valve 243e.

Gas containing hydrogen (hydrogen-containing gas) such as hydrogen ($H_2$) gas is supplied from the third gas supply pipe 232c into the process chamber 201 through the mass flow controller 241c, the valve 243c, the second gas supply pipe 232b, the second nozzle 233b, and the buffer chamber 237. That is, the third gas supply system is configured as a hydrogen-containing gas supply system. At this time, inert gas may be supplied from the third inert gas supply pipe 232f into the third gas supply pipe 232c through the mass flow controller 241f and the valve 243f.

In the current embodiment, $O_2$ gas and $H_2$ gas are supplied into the process chamber 201 (buffer chamber 237) through the same nozzle. However, for example, $O_2$ gas and $H_2$ gas may be supplied into the process chamber 201 through the different nozzles. However, if a plurality of kinds of gases are supplied through the same nozzle, many merits can be obtained. For example, fewer nozzles may be used to reduce apparatus costs, and maintenance works may be easily carried out. For example, if $O_2$ gas and $H_2$ gas are supplied into the process chamber 201 through different nozzles, HCD gas may be supplied into the process chamber 201 through the same nozzle as that used to supply the $H_2$ gas. In a film-forming temperature range (described later), HCD gas and $O_2$ gas may react with each other although HCD gas and $H_2$ gas do not react with each other. Therefore, it may be preferable that HCD gas and $O_2$ gas are supplied into the process chamber 201 through different nozzles.

Inside the buffer chamber 237, as shown in FIG. 2, a first rod-shaped electrode 269 which is a first electrode having a long slender shape, and a second rod-shaped electrode 270 which is a second electrode having a long slender shape are disposed in a manner that the first and second rod-shaped electrodes 269 and 270 extend from the lower side to the upper side of the reaction tube 203 in the direction in which the wafers 200 are stacked. Each of the first and second rod-shaped electrodes 269 and 270 is parallel to the second nozzle 233b. The first and second rod-shaped electrodes 269 and 270 are respectively protected by electrode protection pipes 275 which cover the first and second rod-shaped electrodes 269 and 270 from the upper parts to the lower parts thereof. One of the first and second rod-shaped electrodes 269 and 270 is connected to a high-frequency power source 273 through a matching device 272, and the other is grounded to the earth (reference potential). Therefore, plasma can be generated in a plasma generation region 224 between the first and second rod-shaped electrodes 269 and 270. A plasma source, which is a plasma generator (plasma generating unit), is constituted mainly by the first rod-shaped electrode 269, the second rod-shaped electrode 270, the electrode protection pipes 275, the matching device 272, and the high-frequency power source 273. The plasma source is used as an activation mechanism for activating gas by using plasma.

The electrode protection pipes 275 are configured such that the first and second rod-shaped electrodes 269 and 270 can be inserted into the buffer chamber 237 in a state where the first and second rod-shaped electrodes 269 and 270 are respectively isolated from the atmosphere of the buffer chamber 237. If the insides of the electrode protection pipes 275 have the same atmosphere as the outside air (atmosphere), the first and second rod-shaped electrodes 269 and 270 that are respectively inserted in the electrode protection pipes 275 may be oxidized due to heat emitted from the heater 207. Therefore, an inert gas purge mechanism is disposed to prevent oxidation of the first rod-shaped electrode 269 or the second rod-shaped electrode 270 by filling or purging the insides of the electrode protection pipes 275 with inert gas such as nitrogen to maintain the oxygen concentration of the insides of the electrode protection pipes 275 at a sufficiently low level.

At the reaction tube 203, an exhaust pipe 231 is disposed to exhaust the inside atmosphere of the process chamber 201. A vacuum pump 246 which is a vacuum exhaust device is connected to the exhaust pipe 231 through a pressure sensor 245 which is a pressure detector (pressure detecting part) configured to detect the inside pressure of the process chamber 201 an auto pressure controller (APC) valve 244 which is a pressure regulator (pressure control unit). The APC valve 244 is an on-off valve, which can be opened and closed to start and stop vacuum evacuation of the inside of the process chamber 201 and can be adjusted in degree of valve opening for pressure adjustment. By controlling the degree of opening of the APC valve 244 based on pressure information detected by the pressure sensor 245 while operating the vacuum pump 246, the inside of the process chamber 201 can be vacuum-evacuated to a predetermined pressure (vacuum degree). Mainly, the exhaust pipe 231, the APC valve 244, the vacuum pump 246, and the pressure sensor 245 constitute an exhaust system.

At the lower side of the reaction tube 203, a seal cap 219 is disposed as a furnace port cover capable of hermetically closing the opened bottom side of the reaction tube 203. The seal cap 219 is configured to make contact with the bottom side of the reaction tube 203 in a perpendicular direction from the lower side. For example, the seal cap 219 is made of a metal such as stainless steel and has a disk shape. On the surface of the seal cap 219, an O-ring 220 is disposed as a seal member configured to make contact with the bottom side of the reaction tube 203. At a side of the seal cap 219 opposite to the process chamber 201, a rotary mechanism 267 is disposed to rotate a substrate holding tool such as the boat 217 (described later). A shaft 255 of the boat rotary mechanism 267 penetrates the seal cap 219 and is connected to the boat 217. By rotating the boat 217 with the rotary mechanism 267, wafers 200 can be rotated. The seal cap 219 is configured to be vertically moved by an elevating mechanism such as a boat elevator 115 vertically disposed at the outside of the reaction tube 203. The boat elevator 115 is configured so that the boat 217 can be loaded into and unloaded from the process chamber 201 by raising and lowering the seal cap 219 with the boat elevator 115.

The boat 217, which is a substrate support tool, is made of a heat-resistant material such as quartz or silicon carbide and is configured to support a plurality of wafers 200 in a state where the wafers 200 are horizontally oriented and arranged in multiple stages with the centers of the wafers 200 being aligned with each other. At the lower part of the boat 217, an insulating member 218 made of a heat-resistant material such as quartz or silicon carbide is disposed so as to prevent heat transfer from the heater 207 to the seal cap 219. The insulating member 218 may include a plurality of insulating plates made of a heat-resistant material such as quartz or silicon carbide, and an insulating plate holder configured to support the insulating plates in a state where the insulating plates are horizontally oriented and arranged in multiple stages.

Inside the reaction tube 203, a temperature sensor 263 is disposed as a temperature detector, and by controlling power supplied to the heater 207 based on temperature information detected by the temperature sensor 263, desired temperature distribution can be attained at the inside of the process chamber 201. Like the first and second nozzles 233a and 233b, the temperature sensor 263 has an L-shape and is disposed along the inner wall of the reaction tube 203.

A controller 121, which is a controller (control device), is connected to devices such as the mass flow controllers 241a, 241b, 241c, 241d, 241e, and 241f; valves 243a, 243b, 243c, 243d, 243e, and 243f; the pressure sensor 245; the APC valve 244; the vacuum pump 246; the heater 207; the temperature sensor 263; the boat rotary mechanism 267; the boat elevator 115; the high-frequency power source 273; and the matching device 272. The controller 121 controls, for example, flow rates of various gases by using the mass flow controllers 241a, 241b, 241c, 241d, 241e, and 241f; opening/closing operations of the valves 243a, 243b, 243c, 243d, 243e, and 243f; opening/closing operations of the APC valve 244 and pressure adjusting operations of the APC valve 244 based on the pressure sensor 245; the temperature of the heater 207 based on the temperature sensor 263; starting/stopping operations of the vacuum pump 246; the rotation speed of the boat rotary mechanism 267; ascending and descending operations of the boat 217 activated by the boat elevator 115; power supply to the high-frequency power source 273; and impedance adjusting operations using the matching device 272.

Next, an explanation will be given on an exemplary method of forming an insulating film such as an oxide film on a substrate by using the process furnace 202 of the substrate processing apparatus in one process of processes of manufacturing a semiconductor device. In the following description, the controller 121 controls parts of the substrate processing apparatus.

Figure 3:
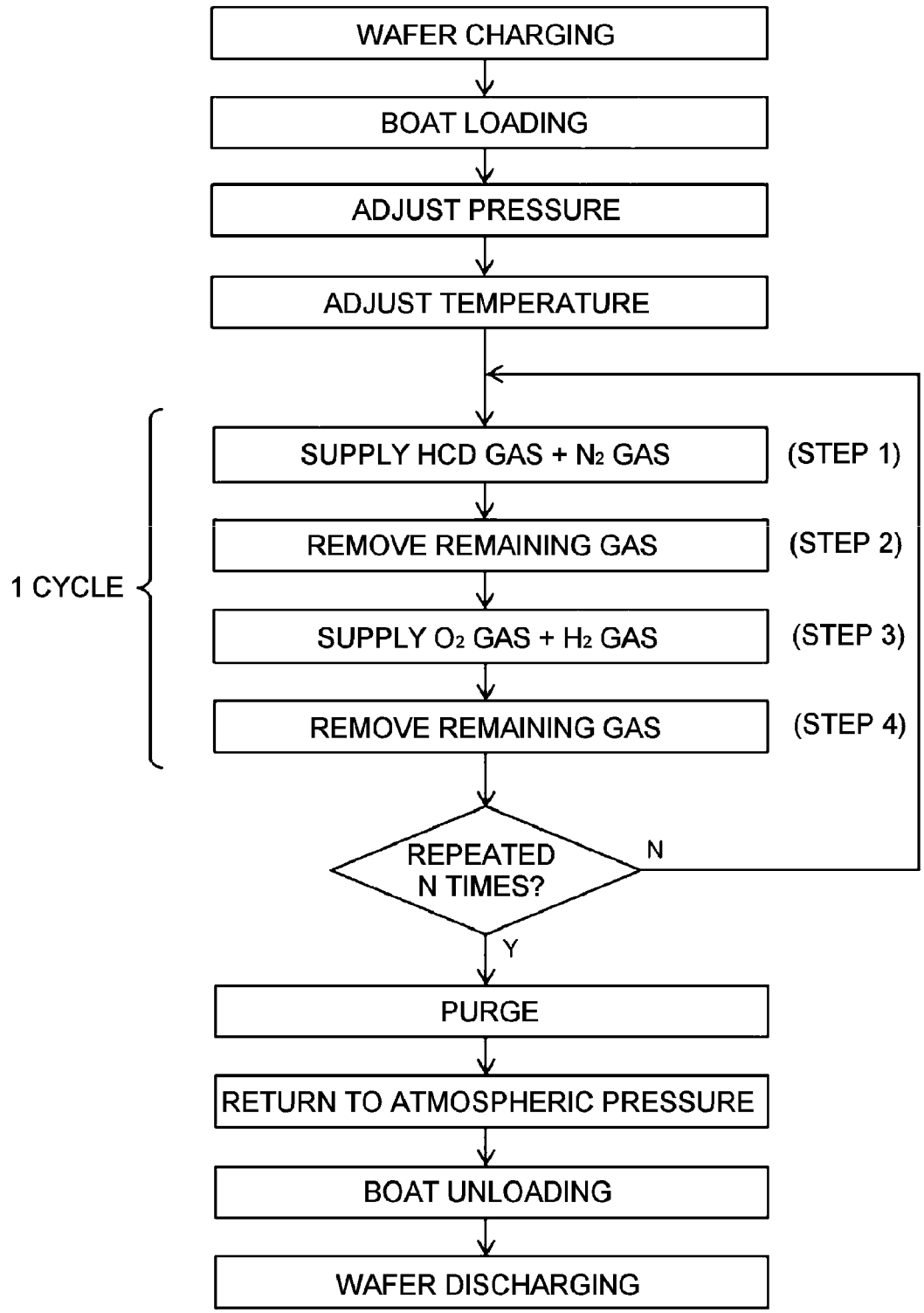
FIG. 3 is a flowchart for explaining film forming flows according to the embodiment of the present invention.
Figure 4:
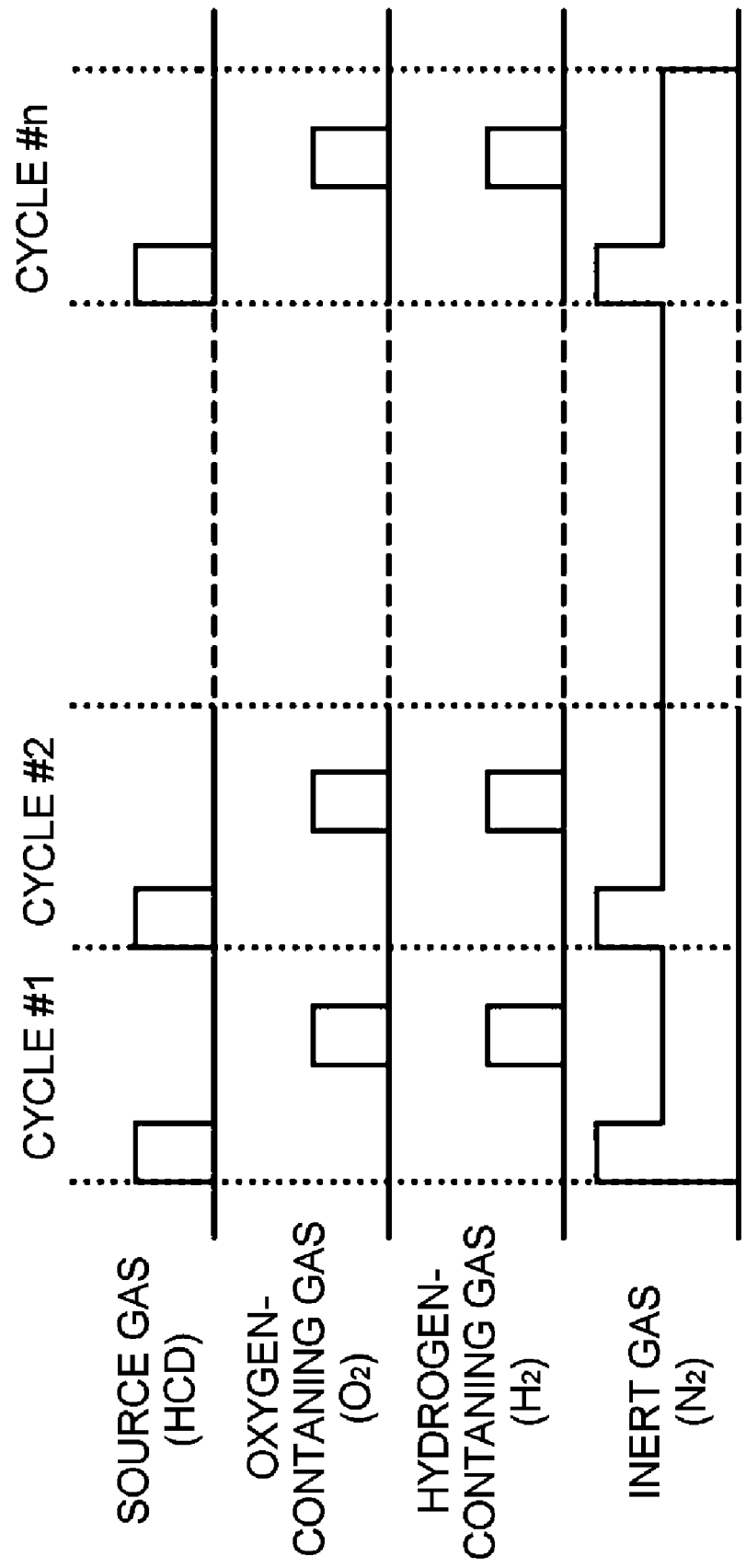
FIG. 4 is a view illustrating gas supply timings of a film-forming sequence for an exemplary case where inert gas is used as a deposition/adsorption inhibition gas according to the embodiment of the present invention.
Figure 5:
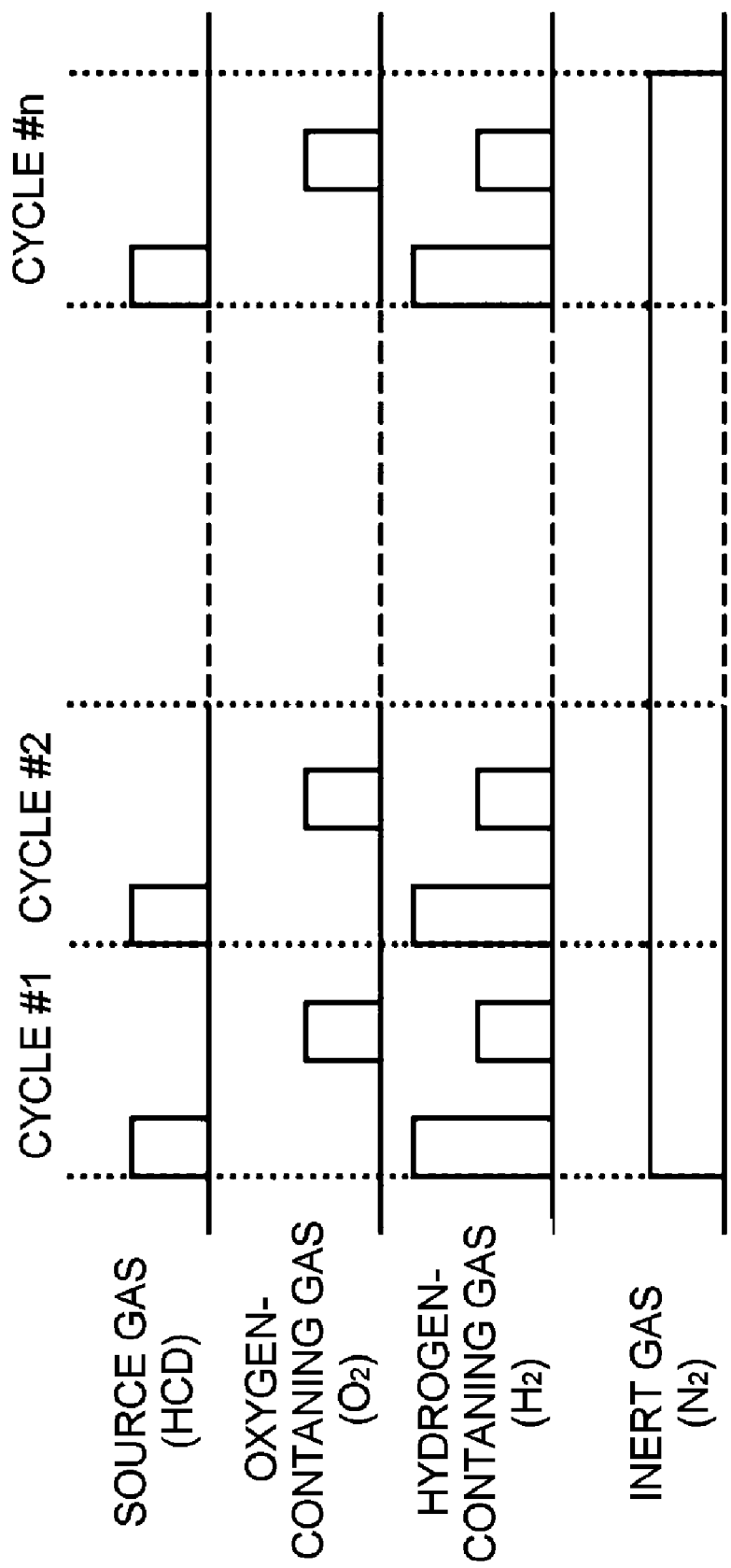
FIG. 5 is a view illustrating gas supply timings of a film-forming sequence for an exemplary case where a hydrogen-containing gas is used as a deposition/adsorption inhibition gas according to the embodiment of the present invention.

FIG. 3 illustrates film-forming flows according to the embodiment of the present invention, and FIG. 4 and FIG. 5 illustrate gas supply timings according to film-forming sequences of the embodiment. In a film-forming sequence of the current embodiment, an oxide film (silicon oxide film) having a predetermined thickness is formed on a substrate by alternately repeating: a process of forming a layer containing a predetermined element (silicon-containing layer) on the substrate by supplying a source gas containing silicon as the predetermined element to an inside of a process vessel which accommodates the substrate and is heated and kept at a pressure lower than atmospheric pressure and exhausting the source gas from the process vessel; and a process of changing the silicon-containing layer into an oxide layer (silicon oxide layer) by supplying an oxygen-containing gas and a hydrogen-containing gas into the process vessel which is heated and kept at a pressure lower than atmospheric pressure and exhausting the oxygen-containing gas and the hydrogen-containing gas from the process vessel, while performing a process of purging the inside of the process vessel by supplying an inert gas into the process vessel and exhausting the inert gas from the process vessel between the process of forming the silicon-containing layer and the process of changing of the silicon-containing layer into the oxide layer. In the process of forming the layer containing the predetermined element, the source gas is supplied toward the substrate through a nozzle disposed at a side of the substrate, and an inert gas or a hydrogen-containing gas is supplied together with the source gas through the nozzle toward the substrate as a deposition/adsorption inhibition gas, so that the flow velocity of the source gas flowing parallel to the surface of the substrate can be greater than the flow velocity of the inert gas flowing parallel to the surface of the substrate in the process of purging the inside of the process vessel.

Hereinafter, a detailed explanation will be given. In the following description of the current embodiment, an explanation will be given on an example where silicon oxide films ($SiO_2$ films) are formed on substrates as insulating films according to the film-forming flows shown in FIG. 3 and the film-forming sequences shown in FIG. 4 and FIG. 5 by using HCD gas as a source gas, $O_2$ gas as an oxygen-containing gas, $H_2$ gas as a hydrogen-containing gas, $N_2$ gas as a deposition/adsorption inhibition gas, and $N_2$ gas as a purge gas.

After a plurality of wafers 200 are charged into the boat 217 (wafer charging), as shown in FIG. 1, the boat 217 in which the plurality of wafers 200 are supported is lifted and loaded into the process chamber 201 by the boat elevator 115 (boat loading). In this state, the bottom side of the reaction tube 203 is sealed by the seal cap 219 with the O-ring 220 being disposed therebetween.

The inside of the process chamber 201 is vacuum-evacuated to a desired pressure (vacuum degree) by using the vacuum pump 246. At this time, the pressure inside the process chamber 201 is measured by the pressure sensor 245, and based on the measured pressure, the APC valve 244 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200. Then, the following four steps are sequentially performed.

[Step 1]

The valve 243a of the first gas supply pipe 232a, and the valve 243d of the first inert gas supply pipe 232d are opened to supply HCD gas through the first gas supply pipe 232a and $N_2$ gas as a deposition/adsorption inhibition gas through the first inert gas supply pipe 232d. The flow rate of the $N_2$ gas flowing through the first inert gas supply pipe 232d is controlled by the mass flow controller 241d. The flow rate of the HCD gas flowing through the first gas supply pipe 232a is controlled by the mass flow controller 241a. The HCD gas and the $N_2$ gas that are adjusted in flow rate are mixed with each other in the first gas supply pipe 232a. Then, the HCD gas and $N_2$ gas are supplied through the gas supply holes 248a of the first nozzle 233a into the process chamber 201 which is heated and depressurized and are exhausted through the gas exhaust pipe 231 (HCD gas+$N_2$ gas supply).

At this time, the APC valve 244 is properly controlled to keep the inside of the process chamber 201 at a pressure lower than atmospheric pressure, for example, in the range from 10 Pa to 1,000 Pa. The supply flow rate of the HCD gas controlled by the mass flow controller 241a is, for example, in the range from 20 sccm to 1,000 sccm (0.02 slm to 1 slm). The supply flow rate of the $N_2$ gas (deposition/adsorption inhibition gas) controlled by the mass flow controller 241d is higher than the supply flow rate of the HCD gas, for example, in the range from 1,000 sccm to 20,000 sccm (1 slm to 20 slm). The wafers 200 are exposed to the HCD gas, for example, for 1 second to 120 seconds. The temperature of the heater 207 is set such that a CVD reaction can be caused in the process chamber 201 in the above-mentioned pressure range. That is, the temperature of the heater 207 is set such that the temperature of the wafers 200 can be kept in the range from 350° C. to 950° C., preferably, in the range from 700° C. to 800° C. If the temperature of the wafers 200 is lower than 350° C., decomposition and adsorption of HCD on the wafers 200 are difficult. In addition, if the temperature of the wafers 200 is higher than 950° C., CVD reaction occurs excessively, and thus the deposition/adsorption inhibition gas can not function sufficiently. Thus, it is difficult to prevent deterioration of film thickness uniformity. If the temperature of the wafers 200 is lower than 700° C., film thickness uniformity is relatively satisfactory. However, if the temperature of the wafers 200 is 700° C. or higher, deterioration of film thickness uniformity is noticeable, and thus the present invention proposing the use of deposition/adsorption inhibition gas is particularly effective. In addition, if the temperature of the wafers 200 is higher than 800° C., CVD reaction occurs strongly, and thus it is necessary to supply the deposition/adsorption inhibition gas at a higher flow rate to prevent deterioration of film thickness uniformity. As a result, consumption of the deposition/adsorption inhibition gas is increased to increase costs. Moreover, undesirably the film-forming rate is decreased. For example, if the temperature of the wafers 200 is set to 900° C., the film-forming rate is reduced to 1/3 as compared with the case where the temperature of the wafers 200 is set in the range of 700° C. to 800° C. Therefore, preferably, the temperature of the wafers 200 is set in the range of 350° C. to 950° C., more preferably, in the range from 700° C. to 800° C.

By supplying HCD gas into the process chamber 201 under the above-described conditions, silicon layers can be formed on the wafers 200 (on under-layer films of the wafers 200) as silicon-containing layers each constituted by less than one atomic layer to several atomic layers. The silicon-containing layers may be HCD gas adsorption layers. The silicon layer is a general term used to denote a layer made of silicon, such as a continuous silicon layer, a discontinuous silicon layer, and a thin film in which such layers are overlapped. In addition, a continuous layer made of silicon may also be called "a thin silicon film." In addition, a HCD gas adsorption layer is a term including a continuous chemical adsorption layer formed by chemical adsorption of molecules of HCD gas and a discontinuous chemical adsorption layer formed by chemical adsorption of molecules of HCD gas. Furthermore, the expression "a layer less than one atomic layer" is used to denote a discontinuous atomic layer. In a condition where HCD gas decomposes by itself, a silicon layer is formed on a substrate by deposition of silicon on the substrate. In a condition where HCD gas does not decompose by itself, an adsorption layer of the HCD gas is formed on a substrate by adsorption of the HCD gas on the substrate. If the thickness of a silicon-containing layer formed on the wafer 200 is greater than the thickness of several atomic layers, the silicon-containing layer may not be entirely oxidized in step 3 (described later). In addition, the minimum of a silicon-containing layer that can be formed on the wafer 200 is less than one atomic layer. Therefore, it may be preferable that the thickness of the silicon-containing layer is set to be in the range from about the thickness of less than one atomic layer to about the thickness of several atomic layers. The case where a silicon layer is formed on a substrate is more preferable than the case where a HCD gas adsorption layer is formed on a substrate because the film-forming rate of the former case is higher than that of the latter case.

Figure 10A:
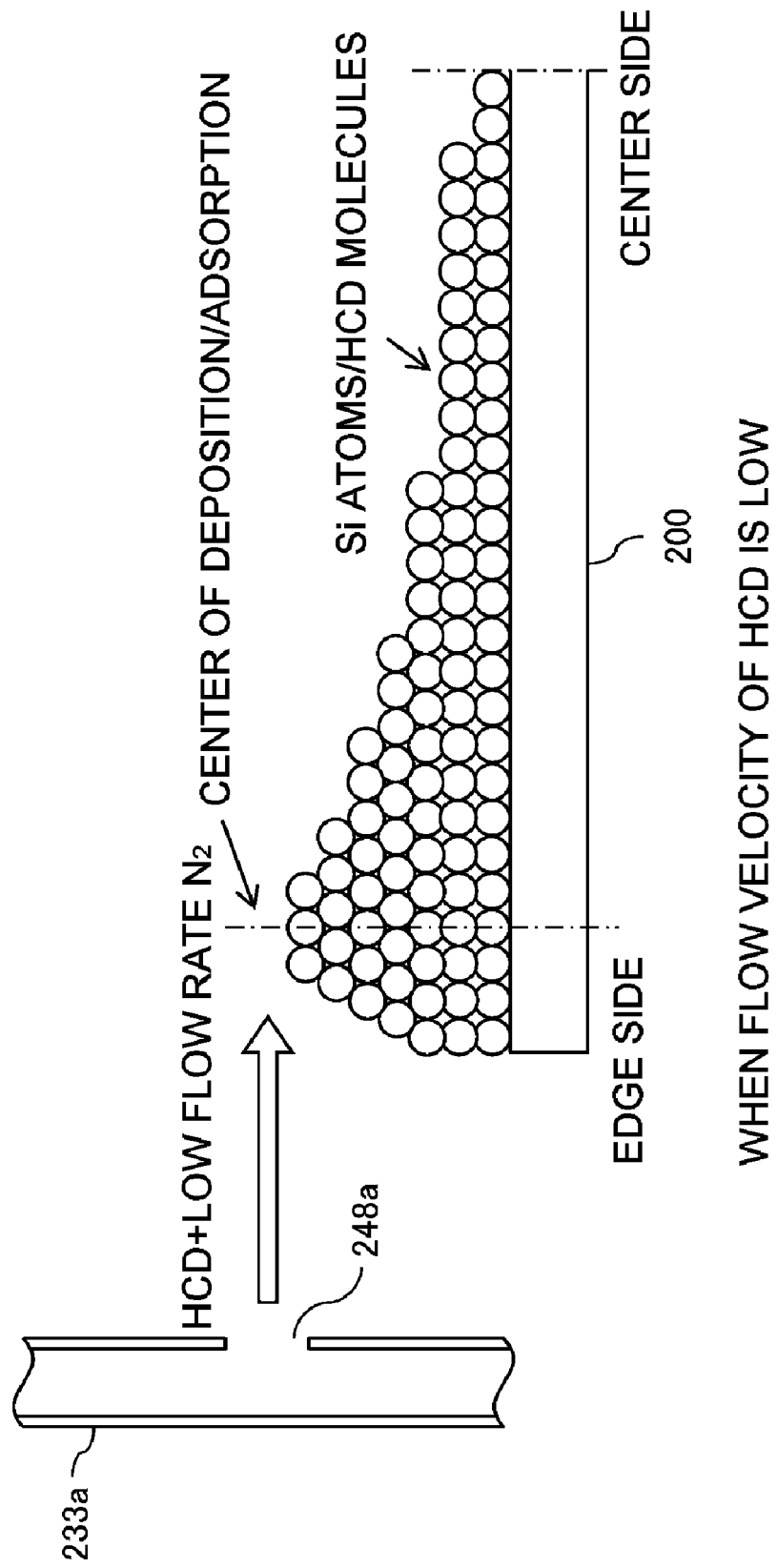
FIG. 10A and FIG. 10B are schematic views illustrating silicon deposition or hexachlorodisilane (HCD) gas adsorption, FIG. 10A illustrating the case where the flow velocity of HCD gas is low, FIG. 10B illustrating the case where the flow velocity of HCD gas is high.
Figure 10B:
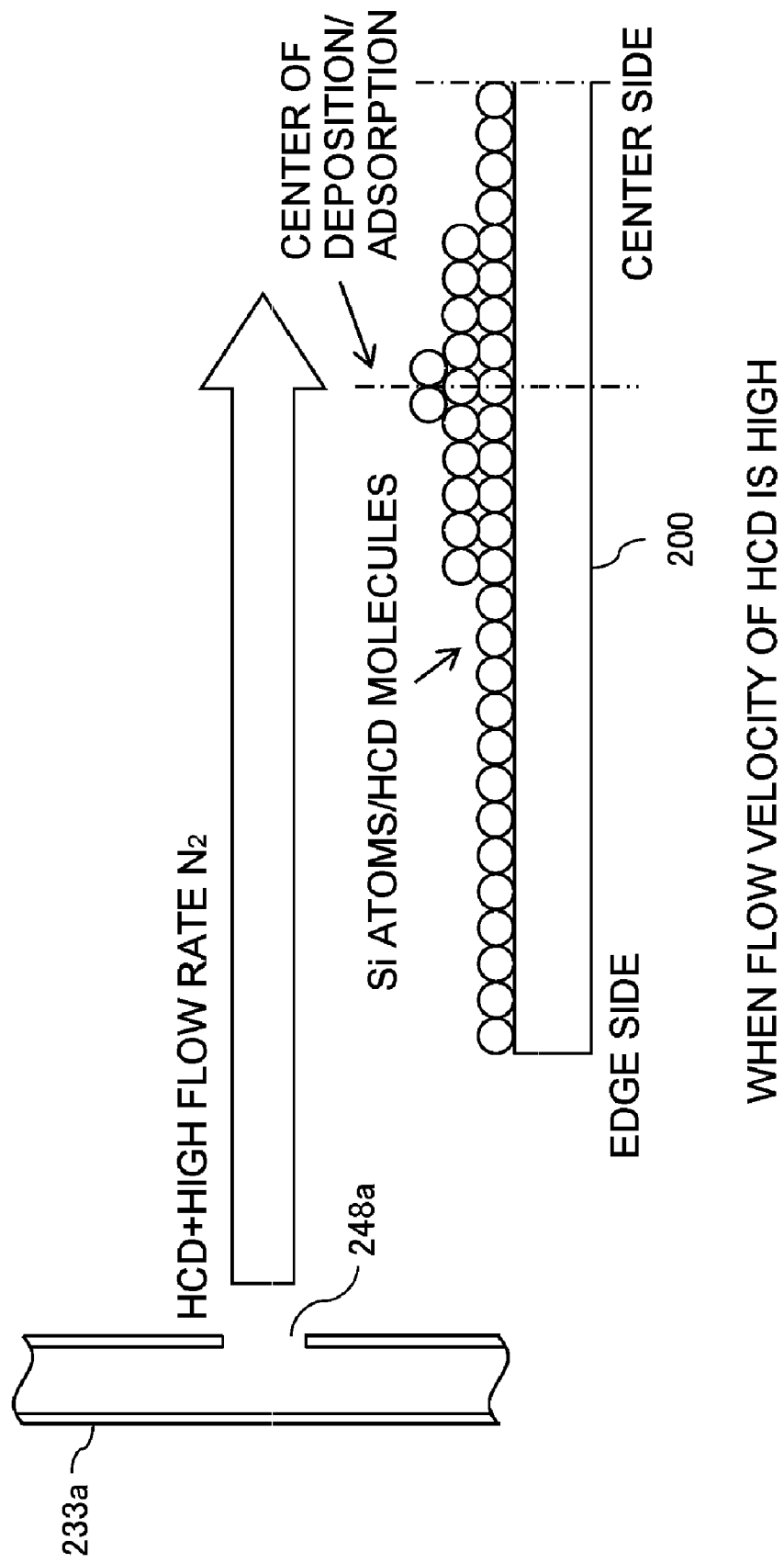

At this time, as described above, $N_2$ gas which is a deposition/adsorption inhibition gas is supplied together with HCD gas at a high flow rate toward the wafers 200 through the first nozzle 233a through which the HCD gas is being supplied, so as to increase the flow velocity of the HCD gas, particularly, the flow velocity of the HCD gas flowing parallel to the surfaces of the wafers 200 (flowing across the surfaces of the wafers 200). That is, HCD gas is injected with high power in a direction parallel to the surfaces of the wafers 200. In this way, deposition efficiency of silicon or adsorption efficiency of HCD gas on the wafers 200 can be reduced to form silicon-containing layers on the wafers 200 while controlling deposition or adsorption. Owing to the action of the deposition/adsorption inhibition gas, as shown in FIG. 10A and FIG. 10B, a center of the deposition or adsorption of a silicon-containing layer can be moved closer to the center of a wafer 200 from an edge side of the wafer 200. In addition, the thickness difference between the thickest part and the thinnest part of the silicon-containing layer can be reduced. For example, even in a high temperature region of 700° C. or higher where adsorption reaction collapses, that is, in a region where deposition or adsorption of the silicon-containing layer is excessive, the silicon-containing layer can be uniformly formed.

FIG. 10A is a schematic view illustrating silicon deposition or HCD gas adsorption for the case where the flow velocity of HCD gas flowing parallel to the surface of the wafer 200 is low. FIG. 10B is a schematic view illustrating silicon deposition or HCD gas adsorption for the case where the flow velocity of HCD gas flowing parallel to the surface of the wafer 200 is high. In FIG. 10A and FIG. 10B, white arrows denote the flow directions of HCD gas and $N_2$ gas, and white balls (○) on the wafer 200 denote Si atoms deposited on the wafer 200 or HCD gas molecules adsorbed on the wafer 200. In addition, for convenience reason, only the left half of the wafer 200 is shown in FIG. 10A and FIG. 10B.

As shown in FIG. 10A and FIG. 10B, by increasing the flow velocity of HCD gas flowing parallel to the surface of the wafer 200, the thickness of the silicon-containing layer can be entirely reduced, and along with this, the center of the deposition or adsorption of the silicon-containing layer can be moved closer to the center of the wafer 200 from an edge side of the wafer 200. In addition, the thickness difference between the thickest part and the thinnest part of the silicon-containing layer can be reduced, and thus the silicon-containing layer can be uniformly formed in the surface of the wafer 200.

Preferably, the supply flow rate of $N_2$ gas which is a deposition/adsorption inhibition gas may be set, as described above, in the range from 1 slm to 20 slm. It is preferable that the supply flow rate of $N_2$ gas is higher than the supply flow rate of HCD gas. By setting the supply flow rate of $N_2$ gas in this way to keep the volumetric flow rate of $N_2$ gas higher than the volumetric flow rate of HCD gas, the flow velocity of HCD gas flowing parallel to the surface of the wafer 200 can be increased as compared with the case where only HCD gas is supplied. That is, HCD gas is injected with high power in the direction parallel to the surface of the wafer 200 as compared with the case where only HCD is supplied. In addition, preferably, the supply flow rate of $N_2$ gas which is a deposition/adsorption inhibition gas may be set to be higher than the supply flow rate of $O_2$ gas or $H_2$ gas supplied into the process chamber 201 in step 3 (described later). By setting the supply flow rate of $N_2$ gas in this way to keep the volumetric flow rate of $N_2$ gas higher than the volumetric flow rate of $O_2$ gas or $H_2$ gas, the flow velocity of HCD gas flowing parallel to the surface of the wafer 200 can be set to be higher than the flow velocity of $O_2$ gas or $H_2$ gas flowing parallel to the surface of the wafer 200. That is, HCD gas is injected with more power than $O_2$ gas or $H_2$ gas in the direction parallel to the surface of the wafer 200. In addition, preferably, the supply flow rate of $N_2$ gas which is a deposition/adsorption inhibition gas is set to be higher than the supply flow rate of $N_2$ gas which is supplied into the process chamber 201 as a purge gas in step 2 and step 4 (described later). By setting the supply flow rate of $N_2$ gas which is a deposition/adsorption inhibition gas in this way to keep the volumetric flow rate of $N_2$ gas higher than the volumetric flow rate of $N_2$ gas which is a purge gas, the flow velocity of HCD gas flowing parallel to the surface of the wafer 200 can be set to be higher than the flow velocity of $N_2$ gas flowing parallel to the surface of the wafer 200 as a purge gas. That is, HCD gas is blown more strongly than $N_2$ gas (purge gas) in the direction parallel to the surface of the wafer 200.

Specifically, it may be preferable that the volumetric flow rate of $N_2$ gas which is a deposition/adsorption inhibition gas is about 10 times to 30 times the volumetric flow rate of HCD gas, and is about 5 times to 30 times the volumetric flow rate of $N_2$ gas which is a purge gas. By setting the volumetric flow rate of $N_2$ gas which is deposition/adsorption inhibition gas to be 10 times to 30 times the volumetric flow rate of HCD gas, the flow velocity of HCD gas flowing parallel to the surface of the wafer 200 can be increased more sufficiently. Thus, deposition or adsorption of the silicon-containing layer can be suppressed more sufficiently, and the center of the deposition or adsorption of the silicon-containing layer can be moved closer to the center of the wafer 200 from an edge side of the wafer 200. In addition, the thickness difference between the thickest part and the thinnest part of the silicon-containing layer can be reduced more easily. As a result, film thickness uniformity can be improved more sufficiently. Furthermore, it can be prevented that the flow velocity of HCD gas is excessively increased to excessively suppress deposition or adsorption of the silicon-containing layer and thus to make it difficult to obtain a practicable film-forming rate.

Instead of using HCD as a silicon-containing source, another source may alternatively be used. Examples of such alternative sources include: an inorganic source such as TCS (tetrachlorosilane, $SiCl_4$), DCS (dichlorosilane, $SiH_2Cl_2$), and $SiH_4$ (monosilane); and an organic source such as aminosilane-based 4DMAS (tetrakisdimethylaminosilane, $Si[N(CH_3)_2]_4$), 3DMAS (trisdimethylaminosilane, $Si[N(CH_3)_2]_3H$), 2DEAS (bisdiethylaminosilane, $Si[N(C_2H_5)_2]_2H_2$), and BTBAS (bistertiarybutylaminosilane, $SiH_2[NH(C_4H_9)]_2$).

Instead of using $N_2$ gas as a deposition/adsorption inhibition gas, a rare gas such as Ar gas, He gas, Ne gas, and Xe gas may be used as a deposition/adsorption inhibition gas. In addition, a hydrogen-containing gas may be used as a deposition/adsorption inhibition gas. As a hydrogen-containing gas, gases such as hydrogen ($H_2$) gas or deuterium ($D_2$) gas may be used. FIG. 5 is a view illustrating an exemplary film-forming sequence for the case where a hydrogen-containing gas is used as a deposition/adsorption inhibition gas. The supply flow rate of $H_2$ gas used as a deposition/adsorption inhibition gas is set to be in the range from 1,000 sccm to 20,000 sccm (1 slm to 20 slm) like the supply flow rate of $N_2$ gas used as a deposition/adsorption inhibition gas. By using a rare gas such as Ar gas or He gas or a hydrogen-containing gas such as $H_2$ gas or $D_2$ gas that does not contain nitrogen (N), a silicon oxide film having a low nitrogen (N) concentration (impurity concentration) can be formed.

[Step 2]

After the silicon-containing layers are formed on the wafers 200, the valve 243a of the first gas supply pipe 232a is closed to interrupt the supply of HCD gas. At this time, the APC valve 244 of the exhaust pipe 231 is kept open, and the inside of the process chamber 201 is vacuum-evacuated by using the vacuum pump 246 so as to remove HCD gas remaining in the process chamber 201. At this time, in a state where the valve 243d is opened, supply of $N_2$ gas (inert gas) to the inside of the process chamber 201 is continued. The $N_2$ gas functions as a purge gas so that HCD gas remaining in the process chamber 201 without participating in an reaction or after participating in the formation of the silicon-containing layers can be removed more efficiently (remaining gas removal).

At this time, the temperature of the heater 207 is set such that the temperature of the wafers 200 can be in the range from 350° C. to 950° C., preferably, in the range from 700° C. to 800° C. like in the time when HCD gas is supplied. The supply flow rate of $N_2$ gas functioning as a purge gas is set to be in the range from 200 sccm to 1,000 sccm (0.2 slm to 1 slm). The volumetric flow rate of $N_2$ gas used as a purge gas is not necessary to be higher than the volumetric flow rate of $N_2$ gas used as a deposition/adsorption inhibition gas. That is, although it is lower, sufficient purge effect can be obtained. Conversely, the volumetric flow rate of $N_2$ gas used as a deposition/adsorption inhibition gas is necessary to be higher than the volumetric flow rate of $N_2$ gas used as a purge gas. That is, to obtain the effect of suppressing deposition/adsorption of a silicon-containing layer, it is necessary to set the volumetric flow rate of $N_2$ gas used as a deposition/adsorption inhibition gas to be higher than a volumetric flow rate of $N_2$ gas where only purge effect can be obtained. Thus, when gas remaining in the process chamber 201 is removed by purge, the mass flow controller 241d is controlled to change the supply flow rate of $N_2$ gas through the first inert gas supply pipe 232d from the range of 1 slm to 20 slm to the range of 0.2 slm to 1 slm, and thereby to reduce the volumetric flow rate of $N_2$ gas. Instead of using $N_2$ gas as a purge gas, a rare gas such as Ar gas, He gas, Ne gas, and Xe gas may be used.

[Step 3]

After removing gas remaining in the process chamber 201, the valve 243b of the second gas supply pipe 232b is opened to allow a flow of $O_2$ gas through the second gas supply pipe 232b. The flow rate of the $O_2$ gas flowing through the second gas supply pipe 232b is controlled by the mass flow controller 241b. The $O_2$ gas adjusted in flow rate is supplied through the gas supply holes 248b of the second nozzle 233b into the buffer chamber 237 which is heated and depressurized. At this time, the valve 243c of the third gas supply pipe 232c is also opened so that $H_2$ gas can flow through the third gas supply pipe 232c. The flow rate of the $H_2$ gas flowing through the third gas supply pipe 232c is controlled by the mass flow controller 241c. The $H_2$ gas adjusted in flow rate is supplied to the second gas supply pipe 232b where the $H_2$ gas is supplied through the gas supply holes 248b of the second nozzle 233b into the buffer chamber 237 which is heated and depressurized. When the $H_2$ gas flows through the second gas supply pipe 232b, the $H_2$ gas is mixed with the $O_2$ gas in the second gas supply pipe 232b. That is, a mixture gas of the $O_2$ gas and the $H_2$ gas is supplied through the second nozzle 233b. The mixture gas of the $O_2$ gas and the $H_2$ gas supplied into the buffer chamber 237 is supplied through the gas supply holes 248c of the buffer chamber 237 into the process chamber 201 which is heated and depressurized, and the mixture gas is exhausted through the exhaust pipe 231 ($O_2$ gas and $H_2$ gas supply).

At this time, the valve 243e of the second inert gas supply pipe 232e may be opened to supply an inert gas such as $N_2$ gas through the second inert gas supply pipe 232e. The flow rate of the $N_2$ gas is adjusted by the mass flow controller 241e and is supplied into the second gas supply pipe 232b. In addition, the valve 243f of the third inert gas supply pipe 232f may be opened to supply inert gas such as $N_2$ gas through the third inert gas supply pipe 232f. The flow rate of the N₂ gas is adjusted by the mass flow controller 241f and is supplied into the third gas supply pipe 232c. At this time, a mixture gas of the O₂ gas, H₂ gas, and N₂ gas is supplied through the second nozzle 233b. Instead of using N₂ gas as inert gas, a rare gas such as Ar gas, He gas, Ne gas, and Xe gas may be used as inert gas.

At this time, the APC valve 244 is properly controlled to keep the inside of the process chamber 201 at a pressure lower than atmospheric pressure, for example, in the range from 1 Pa to 1,000 Pa. The flow rate of the O₂ gas controlled by the mass flow controller 241b is, for example, in the range from 1,000 sccm to 10,000 sccm (1 slm to 10 slm). The flow rate of the H₂ gas controlled by the mass flow controller 241c is, for example, in the range from 1,000 sccm to 10,000 sccm (1 slm to 10 slm). The wafers 200 are exposed to the O₂ gas and H₂ gas, for example, for 1 second to 120 seconds. The temperature of the heater 207 is set such that the temperature of the wafers 200 can be kept, for example, in the range from 350° C. to 1,000° C. It was ascertained that oxidizing power could be improved by adding H₂ gas to O₂ gas under a depressurized atmosphere in the above-described temperature range. In addition, it was also ascertained that oxidizing power could not be improved if the temperature of the wafers 200 was too low. However, if the throughput is considered, as long as oxidizing power can be improved, it may be preferable that the wafers 200 are kept at the same temperature as in step 1 where HCD gas is supplied. That is, it may be preferable that the temperature of the heater 207 is set to keep the inside of the process chamber 201 in the same temperature in step 1 and step 3. In this case, the temperature of the heater 207 is set such that the temperature of the wafers 200, that is, the inside temperature of the process chamber 201 can be kept at a constant temperature in the range from 350° C. to 950° C., preferably, in the range from 700° C. to 800° C. in step 1 and step 3. In addition, it may be preferable that the temperature of the heater 207 is set such that the inside temperature of the process chamber 201 can be kept at the same temperature in step 1 through step 4 (described later). In this case, the temperature of the heater 207 is set such that the inside temperature of the process chamber 201 can be kept at a constant temperature in the range from 350° C. to 950° C., preferably, in the range from 700° C. to 800° C. in step 1 through step 4 (described later). In addition, to improve oxidizing power by adding H₂ gas to O₂ gas under a depressurized atmosphere, it is necessary to keep the inside temperature of the process chamber 201 at 350° C. or higher, preferably 400° C. or higher, more preferably, 450° C. or higher. If the inside temperature of the process chamber 201 is kept at 400° C. or higher, it is possible to obtain oxidizing power greater than that in an O₃ oxidizing treatment performed at 400° C. or higher. If the inside temperature of the process chamber 201 is kept at 450° C. or higher, it is possible to obtain oxidizing power greater than that in an O₂ plasma oxidizing treatment performed at 450° C. or higher.

By supplying O₂ gas and H₂ gas into the process chamber 201 under the above-described conditions, the O₂ gas and H₂ gas can be thermally activated without using plasma under a heated and depressurized atmosphere to react with each other, so that an oxidizing species including oxygen (O) such as atomic oxygen can be produced. Then, the silicon-containing layers formed on the wafers 200 in step 1 are oxidized mainly by the oxidizing species. By the oxidation, the silicon-containing layers are changed into silicon oxide layers (SiO₂ layers, hereinafter also referred to as SiO layers simply). By this oxidizing treatment, as described above, oxidizing power can be largely increased as compared with the case where only O₂ gas is supplied. That is, by adding H₂ gas to O₂ gas under a depressurized atmosphere, oxidizing power can be largely increased as compared with the case where only O₂ gas is supplied.

Alternatively, at this time, one or both of O₂ gas and H₂ gas may be activated by plasma. An oxidizing species having more energy can be produced by supplying O₂ gas and H₂ gas after activating the O₂ gas and/or H₂ gas by plasma, and effects such as improvement in device characteristics can be obtained by performing an oxidizing treatment using the oxidizing species. For example, when both of O₂ gas and H₂ gas are activated by plasma, high-frequency power is applied across the first rod-shaped electrodes 269 and 270 from the high-frequency power source 273 through the matching device 272, and then the mixture gas of the O₂ gas and H₂ gas supplied into the buffer chamber 237 is plasma-excited as an activated species and is supplied into the process chamber 201 through the gas supply holes 248c while being exhausted through the exhaust pipe 231. At this time, the high-frequency power applied across the first rod-shaped electrode 269 and the second rod-shaped electrode 270 from the high-frequency power source 273 is set to be in the range of, for example, 50 W to 1,000 W. Other process conditions are set to be the same as those explained in the above description. Furthermore, in the above-described temperature range, O₂ gas and H₂ gas can be thermally activated for sufficient reaction necessary to produce a sufficient amount of oxidizing species. That is, although O₂ gas and H₂ gas are thermally activated without using plasma, sufficient oxidizing power can be obtained. In the case where O₂ gas and H₂ gas are thermally activated and are supplied, soft reaction can be caused, and thus the above-described oxidizing treatment can be softly performed.

As well as oxygen (O₂) gas, another gas such as ozone (O₃) gas may be used as an oxygen-containing gas (oxidizing gas). According to an experiment in which hydrogen-containing gas was added to nitric oxide (NO) gas or nitrous oxide (N₂O) gas in the above-described temperature range, oxidizing power was not improved as compared with the case where only NO gas or N₂O gas was supplied. That is, it is preferable that gas containing oxygen but not nitrogen (that is, gas not containing nitrogen but containing oxygen) is used as oxygen-containing gas. As hydrogen-containing gas, not only hydrogen (H₂) gas but also another gas such as deuterium (D₂) gas may be used. In addition, if gas such as ammonia (NH₃) gas or methane (CH₄) gas is used, nitrogen (N) or carbon (C) may permeate into films as an impurity. That is, it is preferable that gas containing hydrogen but not other elements (that is, gas not containing other elements than hydrogen or deuterium) is used as a hydrogen-containing gas. That is, at least one selected from the group consisting of O₂ gas and O₃ gas may be used as an oxygen-containing gas, and at least one selected from the group consisting of H₂ gas and D₂ gas may be used as a hydrogen-containing gas.

[Step 4]

After the silicon-containing layers are changed into silicon oxide layers, the valve 243b of the second gas supply pipe 232b is closed to interrupt the supply of O₂ gas. In addition, the valve 243c of the third gas supply pipe 232c is closed to interrupt the supply of H₂ gas. At this time, the APC valve 244 of the exhaust pipe 231 is kept open, and the inside of the process chamber 201 is vacuum-evacuated by using the vacuum pump 246 so as to remove O₂ gas and H₂ gas remaining in the process chamber 201. At this time, in a state where the valves 243e and 243f are opened, supply of N₂ gas (inert gas) to the inside of the process chamber 201 is continued. The N₂ gas functions as a purge gas so that O₂ gas and H₂ gas remaining in the process chamber 201 without participating in an reaction or after participating in the formation of the silicon oxide layers can be removed more efficiently (remaining gas removal).

At this time, the temperature of the heater 207 is set such that the temperature of the wafers 200 can be in the range from 350° C. to 950° C., preferably, in the range from 700° C. to 800° C. like in the time when $O_2$ gas and $H_2$ gas are supplied. The supply flow rate of $N_2$ gas functioning as a purge gas is set to be in the range from 200 sccm to 1,000 sccm (0.2 slm to 1 slm). As described above, the volumetric flow rate of $N_2$ gas used as a purge gas is not necessary to be higher than the volumetric flow rate of $N_2$ gas used as a deposition/adsorption inhibition gas. That is, although it is lower, sufficient purge effect can be obtained. Instead of using $N_2$ gas as a purge gas, rare gas such as Ar gas, He gas, Ne gas, and Xe gas may be used as a purge gas.

The above-described step 1 to step 4 are set as one cycle, and the cycle is performed at least once, preferably, a plurality of times, so as to form silicon oxide films having a predetermined thickness on the wafers 200.

After the silicon oxide films are formed to a predetermined thickness, the valves 243d, 243e, and 243f are opened to supply inert gas such as $N_2$ gas into the process chamber 201 through the first inert gas supply pipe 232d, the second inert gas supply pipe 232e, and the third inert gas supply pipe 232f while exhausting the $N_2$ gas through the exhaust pipe 231. The $N_2$ gas functions as a purge gas. Thus, the inside of the process chamber 201 can be purged with inert gas, and gas remaining in the process chamber 201 can be removed (purge). Then, the inside atmosphere of the process chamber 201 is replaced with inert gas, and the inside of the process chamber 201 returns to atmospheric pressure (return to atmospheric pressure).

Thereafter, the boat elevator 115 lowers the seal cap 219 to open the bottom side of the reaction tube 203 and unload the boat 217 in which the processed wafers 200 are held to the outside of the reaction tube 203 through the bottom side of the reaction tube 203 (boat unloading). Then, the processed wafers 200 are discharged from the boat 217 (wafer discharging).

In step 1 of the current embodiment, $N_2$ gas functioning as a deposition/adsorption inhibition gas is supplied together with HCD gas at the above-described high flow rate into the process chamber 201 through the first nozzle 233a, so as to increase the flow velocity of the HCD gas, particularly, the flow velocity of the HCD gas ejected through the gas supply holes 248a of the first nozzle 233a toward the wafers 200 in the direction parallel to the surfaces of the wafers 200 (crossing the surfaces of the wafers 200). By this, deposition efficiency of silicon or adsorption efficiency of HCD gas on the wafers 200 can be reduced to form silicon-containing layers on the wafers 200 while controlling deposition of silicon or adsorption of HCD gas. Owing to the action of the deposition/adsorption inhibition gas, the center of the deposition or adsorptions of the silicon-containing layers can be moved closer to the centers of the wafers 200 from edge sides of the wafers 200. In addition, the thickness differences between the thickest parts and the thinnest parts of the silicon-containing layers can be reduced. For example, even in a high temperature region of 700° C. or higher where adsorption reaction collapses, that is, in a region where deposition or adsorption of the silicon-containing layers is excessive, the silicon-containing layers can be uniformly formed.

Furthermore, in step 3 of the current embodiment, an oxidizing species including oxygen (O) atoms such as atomic oxygen is generated by causing a reaction between $O_2$ gas and $H_2$ gas under a heated and depressurized atmosphere, and a changing process is performed by using the oxidizing species to change the silicon-containing layers into silicon oxide layers in a way of breaking Si—N, Si—Cl, Si—H, and Si—C bonds of the silicon-containing layers by using energy of the oxidizing species. Since the bond energy of a Si—O bond is greater than the bond energy of a Si—N, Si—Cl, Si—H, or Si—C bond, Si—N, Si—Cl, Si—H, and Si—C bonds of a silicon-containing layer can be broken by giving energy necessary to form a SiO bond to the silicon-containing layer which is an oxidizing target. N, H, Cl, and C separated from Si are removed from the layers are discharged in the form of $N_2$, $H_2$, $Cl_2$, HCl, $CO_2$, etc. In addition, Si bonding electrons remaining after N, H, Cl, and C are separated is coupled with O included in the oxidizing species. In this way, the silicon-containing layers are changed into $SiO_2$ layers. It was ascertained that a $SiO_2$ film formed by the film-forming sequence of the current embodiment had very low nitrogen, hydrogen, chlorine, and carbon concentrations and the ratio of Si/O of the $SiO_2$ film was very close to a stoichiometric composition ratio, 0.5. That is, a high-quality $SiO_2$ film could be formed.

In the current embodiment, $O_2$ gas and $H_2$ gas are supplied from the same second nozzle 233b into the process chamber 201 through the buffer chamber 237, and the second nozzle 233b and the buffer chamber 237 are heated to the same temperature as the process chamber 201. Therefore, the $O_2$ gas and $H_2$ gas react with each other in the second nozzle 233b and the buffer chamber 237 which are heated and kept at a pressure lower than atmospheric pressure, and thus an oxidizing species containing oxygen is generated in the second nozzle 233b and the buffer chamber 237. In addition, the insides of the second nozzle 233b and the buffer chamber 237 are kept at a pressure higher than the inside pressure of the process chamber 201. This facilitates the reaction between the $O_2$ gas and $H_2$ gas in the second nozzle 233b and the buffer chamber 237, and thus a more amount of oxidizing species can be generated by the reaction between the $O_2$ gas and $H_2$ gas to increase oxidizing power much more. In addition, since the $O_2$ gas and $H_2$ gas can be mixed with each other more uniformly in the second nozzle 233b and the buffer chamber 237 before being supplied into the process chamber 201, the $O_2$ gas and $H_2$ gas can react with each other more uniformly to produce an oxidizing species having a uniform concentration, and thus oxidizing power can be uniformly applied between the wafers 200. As described above, since $O_2$ gas and $H_2$ gas are supplied into the process chamber 201 through the same nozzle, oxidizing power can be increased much more, and the uniformity of the oxidizing power can be improved much more. Furthermore, if plasma is not used, the buffer chamber 237 may be omitted. However, even in this case, the same effects as those described above can be attained.

In the case where $O_2$ gas and $H_2$ gas are supplied from the same second nozzle 233b into the process chamber 201 through the buffer chamber 237, although a more amount of oxidizing species can be produced in the second nozzle 233b and the buffer chamber 237, the oxidizing species may be deactivated while passing through the second nozzle 233b and the buffer chamber 237, and thus the amount of oxidizing species reaching the wafers 200 may be decreased. On the other hand, if $O_2$ gas and $H_2$ gas are supplied into the process chamber 201 from different nozzles, since the $O_2$ gas and $H_2$ gas start to mix with each other in the process chamber 201, an oxidizing species is generated in the process chamber 201 so that it may be possible to prevent the oxidizing species from being deactivated in the second nozzle 233b or the buffer chamber 237.

In addition, it was ascertained that if a silicon oxide film was formed according to the film-forming sequence of the current embodiment, the film thickness uniformity within a wafer could be improved as compared with the case where a silicon oxide film was formed according to a general CVD method. In a general CVD method, inorganic sources such as DCS and $N_2O$ are simultaneously supplied to form a silicon oxide film (HTO (high temperature oxide) film) by CVD. It was ascertained that the impurity concentrations such as nitrogen and chlorine concentrations of a silicon oxide film formed by the film-forming sequence of the current embodiment were much lower than those of a silicon oxide film formed by a general CVD method. In addition, it was ascertained that the impurity concentrations of a silicon oxide film formed by the film-forming sequence of the current embodiment were much lower than those of a silicon oxide film formed by a CVD method using an organic silicon source. In addition, according to the film-forming sequence of the current embodiment, although an organic silicon source was used, the film thickness uniformity within a wafer and the impurity concentrations of a film were satisfactory.

In the above-described embodiment, $H_2$ gas which is a hydrogen-containing is intermittently supplied as shown in FIG. 4. That is, explanation has been given on an exemplary case where $H_2$ gas is supplied only in step 3. However, $H_2$ gas may be continuously supplied. That is, $H_2$ gas may be constantly supplied while step 1 to step 4 are repeated. Alternatively, $H_2$ gas may be intermittently supplied in step 1 and step 3 as shown in FIG. 5 or in step 1 to step 3. Alternatively, $H_2$ gas may be supplied in step 2 and step 3 or in step 3 and step 4. In FIG. 5, $H_2$ gas supplied in step 1 is a deposition/adsorption inhibition gas.

In step 1, that is, when HCD gas is supplied, $H_2$ gas is also supplied. Thus, as well as deposition of silicon or adsorption of HCD gas being suppressed, Cl included in the HCD gas may be extracted to improve the film-forming rate and reduce the amount of Cl impurity included in a film. Furthermore, in step 2, that is, after the supply of HCD gas is stopped, $H_2$ gas may be supplied before $O_2$ gas is supplied for effectively controlling film thickness uniformity. Furthermore, in step 2, by supplying $H_2$ gas prior to supply of $O_2$ gas, for example, an oxide film may be formed on parts where metal and silicon are exposed in a manner that the oxide film is uniformly laid on the metal and silicon without oxidizing the metal. Furthermore, in step 4, that is, after supply of $O_2$ is stopped but supply of HCD gas is not started, $H_2$ gas may be supplied to terminate the surface of a SiO layer formed in step 3 with hydrogen so that HCD gas supplied in the next step 1 can be easily adsorbed on the surface of the SiO layer.

Furthermore, in the above-described embodiment, deposition/adsorption inhibition gas is used to increase the flow velocity of HCD gas flowing parallel to the surfaces of the wafers 200, and thus to suppress deposition of silicon or adsorption of the HCD gas on the wafers 200 for improving film thickness uniformity. However, a method of increasing the flow velocity of HCD gas is not limited thereto.

For example, by making the flow resistance of the inside of the reaction tube 203 equal to the flow resistance between the wafers 200, the flow velocity of HCD gas flowing parallel to the surfaces of the wafers 200 can be increased. For example, by filling the upper or lower space of the reaction tube 203 with dummy wafers or insulating plates, the flow velocity of HCD gas flowing parallel to the surfaces of the wafers 200 can be increased to suppress deposition of silicon or adsorption of the HCD gas on the wafers 200 for improving film thickness uniformity.

In addition, for example, the conductance between the wafers 200 and the first nozzle 233a through which HCD gas is supplied may be made to be equal to the conductance between the wafers 200 for increasing the flow velocity of HCD gas flowing parallel to the surfaces of the wafers 200. For example, by increasing the diameter of the first nozzle 233a or decreasing the diameter of the reaction tube 203, the flow velocity of HCD gas flowing parallel to the surfaces of the wafers 200 can be increased to suppress deposition of silicon or adsorption of the HCD gas on the wafers 200 for improving film thickness uniformity.

In addition, for example, by repeating supply and exhaustion of HCD gas, the flow velocity of HCD gas flowing parallel to the surfaces of the wafers 200 can be increased. For example, by increasing the pressure difference between the wafer arrangement region of the inside of the reaction tube 203 and the inside of the first nozzle 233a (the inside of the buffer chamber 237), the flow velocity of HCD gas flowing parallel to the surfaces of the wafers 200 can be increased to suppress deposition of silicon or adsorption of the HCD gas on the wafers 200 for improving film thickness uniformity.

Furthermore, in the above-described embodiment, step 1, step 2, step 3, and step 4 are sequentially performed. Step 1, step 2, step 3, and step 4 are set as one cycle, and the cycle is performed at least once, preferably, a plurality of times, to form silicon oxide films having a predetermined thickness on the wafers 200. Unlike this, the order of step 1 and step 3 may be changed. That is, step 3, step 2, step 1, and step 4 may be sequentially performed. Step 3, step 2, step 1, and step 4 may be set as one cycle, and the cycle may be performed at least once, preferably, a plurality of times, so as to form silicon oxide films on the wafers 200 to a predetermined thickness.

Furthermore, in the above-described embodiment, silicon oxide films ($SiO_2$ films) containing semiconductor silicon (Si) are formed on substrates as oxide films. However, the present invention may be applied to other cases where metal oxide films containing a metal element such as zirconium (Zr), hafnium (Hf), titanium (Ti), or aluminum (Al) are formed on substrates as oxide films. In this case, formation of layers containing a metal element on substrates by supplying a source gas and a deposition/adsorption inhibition gas (step 1); removal of remaining gas by purge (step 2); changing the layers containing a metal element into metal oxide layers by supplying an oxygen-containing gas and an hydrogen-containing gas (step 3); and removal of remaining gas by purge (step 4) are set as one cycle, and the cycle is performed at least once, preferably, a plurality of times, to form metal oxide films having a predetermined thickness on the substrates.

For example, zirconium oxide films ($ZrO_2$ films) may be formed on substrates as metal oxide films containing zirconium (Zr) in the following manner. Formation of zirconium-containing layers on the substrates by supplying a source gas and a deposition/adsorption inhibition gas (step 1); removal of remaining gas by purge (step 2); changing the zirconium-containing layers into zirconium oxide layers by supplying an oxygen-containing gas and an hydrogen-containing gas (step 3); and removal of remaining gas by purge (step 4) are set as one cycle, and the cycle is performed at least once, preferably, a plurality of times, to form zirconium oxide films having a predetermined thickness on the substrates. For example, TEMAZ (tetrakis(ethylmethylamino)zirconium: $Zr[N(C_2H_5)(CH_3)]_4$) gas may be used as the source gas. Like in the above-described embodiment, $O_2$ gas and $H_2$ gas may be used as the oxygen-containing gas and the hydrogen-containing gas, respectively. In this case, the first gas supply system (source gas supply system) of the substrate processing apparatus of the above-described embodiment may be configured as a zirconium-containing gas supply system. In addition, processing conditions may be selected within the processing condition ranges described in the above embodiments.

In addition, for example, hafnium oxide films (HfO$_2$ films) may be formed on substrates as metal oxide films containing hafnium (Hf) in the following manner Formation of hafnium-containing layers on the substrates by supplying a source gas and a deposition/adsorption inhibition gas (step 1); removal of remaining gas by purge (step 2); changing the hafnium-containing layers into hafnium oxide layers by supplying an oxygen-containing gas and an hydrogen-containing gas (step 3); and removal of remaining gas by purge (step 4) are set as one cycle, and the cycle is performed at least once, preferably, a plurality of times, to form hafnium oxide films having a predetermined thickness on the substrates. Examples of the source gas include TEMAH (tetrakis(ethylmethylamino)hafnium: Hf[N(C$_2$H$_5$)(CH$_3$)]$_4$) gas or TDMAH (tetrakis(dimethylamino)hafnium: Hf[N(CH$_3$)$_2$]$_4$) gas. Like in the above-described embodiment, O$_2$ gas and H$_2$ gas may be used as the oxygen-containing gas and the hydrogen-containing gas, respectively. In this case, the first gas supply system (source gas supply system) of the substrate processing apparatus of the above-described embodiment may be configured as a hafnium-containing gas supply system. In addition, processing conditions may be selected within the processing condition ranges described in the above embodiments.

In addition, for example, titanium oxide films (TiO$_2$ films) may be formed on substrates as metal oxide films containing titanium (Ti) in the following manner. Formation of titanium-containing layers on the substrates by supplying a source gas and a deposition/adsorption inhibition gas (step 1); removal of remaining gas by purge (step 2); changing the titanium-containing layers into titanium oxide layers by supplying an oxygen-containing gas and an hydrogen-containing gas (step 3); and removal of remaining gas by purge (step 4) are set as one cycle, and the cycle is performed at least once, preferably, a plurality of times, to form titanium oxide films having a predetermined thickness on the substrates. Examples of the source gas include TiCl$_4$ (titanium tetrachloride) gas or TDMAT (tetrakis(dimethylamino)titanium: Ti[N(CH$_3$)$_2$]$_4$) gas. Like in the above-described embodiment, O$_2$ gas and H$_2$ gas may be used as the oxygen-containing gas and the hydrogen-containing gas, respectively. In this case, the first gas supply system (source gas supply system) of the substrate processing apparatus of the above-described embodiment may be configured as a titanium-containing gas supply system. In addition, processing conditions may be selected within the processing condition ranges described in the above embodiments.

For example, aluminum oxide films (Al$_2$O$_3$ films) may be formed on substrates as metal oxide films containing aluminum (Zr) in the following manner. Formation of aluminum-containing layers on the substrates by supplying a source gas and a deposition/adsorption inhibition gas (step 1); removal of remaining gas by purge (step 2); changing the aluminum-containing layers into aluminum oxide layers by supplying an oxygen-containing gas and an hydrogen-containing gas (step 3); and removal of remaining gas by purge (step 4) are set as one cycle, and the cycle is performed at least once, preferably, a plurality of times, to form aluminum oxide films having a predetermined thickness on the substrates. For example, TMA (trimethyl-aluminum: Al(CH$_3$)$_3$) may be used as the source gas. Like in the above-described embodiment, O$_2$ gas and H$_2$ gas may be used as the oxygen-containing gas and the hydrogen-containing gas, respectively. In this case, the first gas supply system (source gas supply system) of the substrate processing apparatus of the above-described embodiment may be configured as an aluminium-containing gas supply system. In addition, processing conditions may be selected within the processing condition ranges described in the above embodiments.

As described above, the film-forming sequence of the current embodiment can also be applied to a process of forming a metal oxide such as a high permittivity insulating film (high-k insulating film). That is, the film-forming sequence of the current embodiment can be applied to the case where a predetermined element included in an oxide film is a metal element as well as the case where the predetermined element is a semiconductor element. However, so as to perform an non-plasma oxidizing treatment in step 3, that is, so as to generate an oxidizing species including oxygen such as atomic oxygen by causing an oxygen-containing gas and an hydrogen-containing gas to react with each other under a heated and depressurized atmosphere and perform an oxidizing treatment using the oxidizing species, it is necessary to set the temperature of the process chamber 201 (wafer temperature) at least to 350° C. or higher. At temperatures lower than 350° C., sufficient oxidizing treatment may not be performed. It was ascertained that applications of the present invention to formation of metal oxide films and formation of silicon oxide films resulted the same effects.

EXAMPLES

First Example

Next, a first example will be described.

Silicon oxide films were formed on wafers according to the film-forming sequence of the current embodiment by using a deposition/adsorption inhibition gas, the film-forming sequence of the current embodiment without using a deposition/adsorption inhibition gas, and a general CVD method, respectively. Then, thickness uniformities (WIW Unif) of the silicon oxide films in surfaces of the wafers were measured. In the general CVD method, DCS and N$_2$O were simultaneously supplied to form a silicon oxide film (HTO film) by CVD, and the film-forming temperature was set to 800° C. In the film-forming sequence of the current embodiment, the film-forming temperature was varied in the range from 450° C. to 800° C. Other film-forming conditions (process conditions in each step) were set in the process condition ranges described in the previous embodiments.

Figure 6:
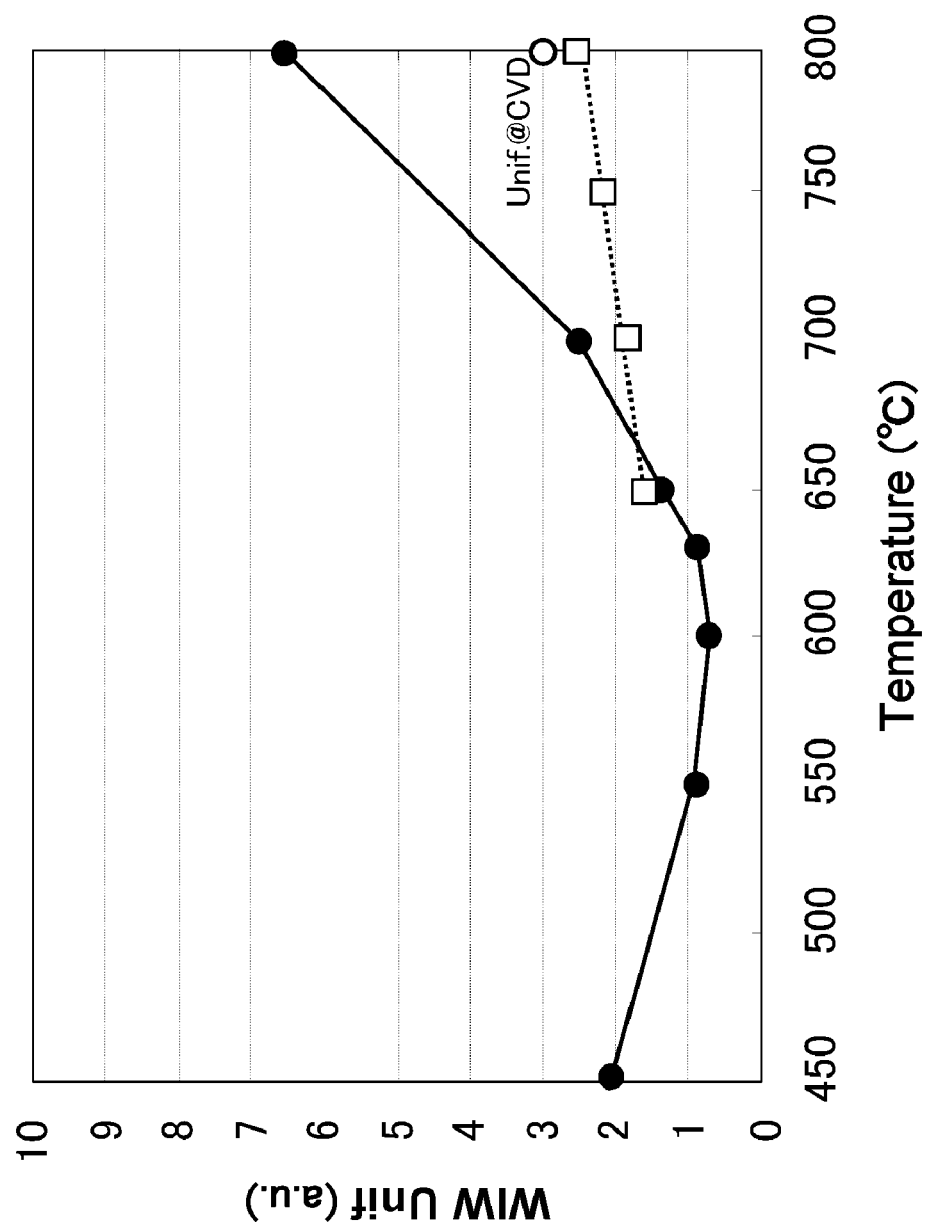
FIG. 6 is a view illustrating a relationship between within-wafer thickness uniformity and wafer temperature for the case where a deposition/adsorption inhibition gas is not used and the case where the deposition/adsorption inhibition gas is used in a film-forming sequence of the embodiment of the present invention.

The results are shown in FIG. 6. FIG. 6 illustrates a relationship between within-wafer thickness uniformity and film-forming temperature (wafer temperature). In FIG. 6, the horizontal axis denotes film-forming temperature (° C.), and the vertical axis denotes within-wafer thickness uniformity (arbitrary unit). In FIG. 6, black dots (●) denote the within-wafer thickness uniformity of silicon oxide films formed according to the film-forming sequence of the current embodiment without using a deposition/adsorption inhibition gas. In addition, white circles (○) denote the within-wafer thickness uniformity of silicon oxide films formed by the general CVD method. In addition, white rectangles (□) denote the within-wafer thickness uniformity of silicon oxide films formed according to the film-forming sequence of the current embodiment by using a deposition/adsorption inhibition gas. The within-wafer thickness uniformity denotes the degree of variations of film thickness distribution in a surface of a wafer, and a lower value of the within-wafer thickness uniformity denotes better within-wafer thickness uniformity.

As shown in FIG. 6, when the film-forming temperature is higher than 700° C., the within-wafer thickness uniformity of a silicon oxide film formed according to the film-forming sequence of the current embodiment without using a deposition/adsorption inhibition gas is worse than the within-wafer thickness uniformity of a silicon oxide film formed according to the general CVD method; and when the film-forming temperature is 700° C. or lower, it becomes better than the within-wafer thickness uniformity of the silicon oxide film formed according to the general CVD method. That is, if a silicon oxide film is formed according to the film-forming sequence of the current embodiment without using a deposition/adsorption inhibition gas, the within-wafer thickness uniformity of the silicon oxide film is noticeably worsened particularly in a high temperature region of 700° C. or higher. However, the within-wafer thickness uniformity of a silicon oxide film formed according to the film-forming sequence of the current embodiment by using a deposition/adsorption inhibition gas is better than the within-wafer thickness uniformity of the silicon oxide film formed according to the general CVD method even when the film-forming temperature is higher than 700° C., for example, in the range of 700° C. to 800° C. That is, if a silicon oxide film is formed according to the film-forming sequence of the current embodiment by using a deposition/adsorption inhibition gas, the within-wafer thickness uniformity of the silicon oxide film is largely improved even in a high temperature region of 700° C. or higher.

Second Example

Next, a second example will be described.

Silicon oxide films were formed on wafers according to the film-forming sequence of the embodiment, and the thicknesses and within-wafer thickness uniformity (WIW Unif) of the silicon oxide films were measured. The film-forming temperature (wafer temperature) was set in the range of 700° C. to 800° C. where within-wafer thickness uniformity was noticeably deteriorated in the first example. The supply flow rate of HCD gas was set to a constant value within the range from 0.1 slm to 0.5 slm, and the supply flow rate of $N_2$ gas used as a deposition/adsorption inhibition gas was varied to three values within the range from 2 slm to 6 slm. If the three supply flow rates of $N_2$ gas are shown relative to the minimum supply flow rate, that is, as ratios by setting the minimum supply flow rate to 1, they are (A) 1, (B) 1.6, and (C) 2.0. Hereinafter, these will be referred to as a flow rate condition (A), a flow rate condition (B), and a flow rate condition (C). The ratio of the supply flow rate of $N_2$ gas used as a deposition/adsorption inhibition gas to the supply flow rate of HCD gas (ratio of $N_2$ flow rate/HCD flow rate) was varied in the range from 10 to 30, and the ratio of the supply flow rate of $N_2$ gas used as a deposition/adsorption inhibition gas to the supply flow rate of $N_2$ gas used as a purge gas ($N_2$ (deposition/adsorption inhibition gas) flow rate/$N_2$ (purge gas) flow rate) was varied in the range from 5 to 30. Other film-forming conditions (process conditions in each step) were set in the process condition ranges described in the above-described embodiment. Φ 300-mm silicon wafers were used in this example. The results are shown in FIG. 7 and FIG. 8.

Figure 7:
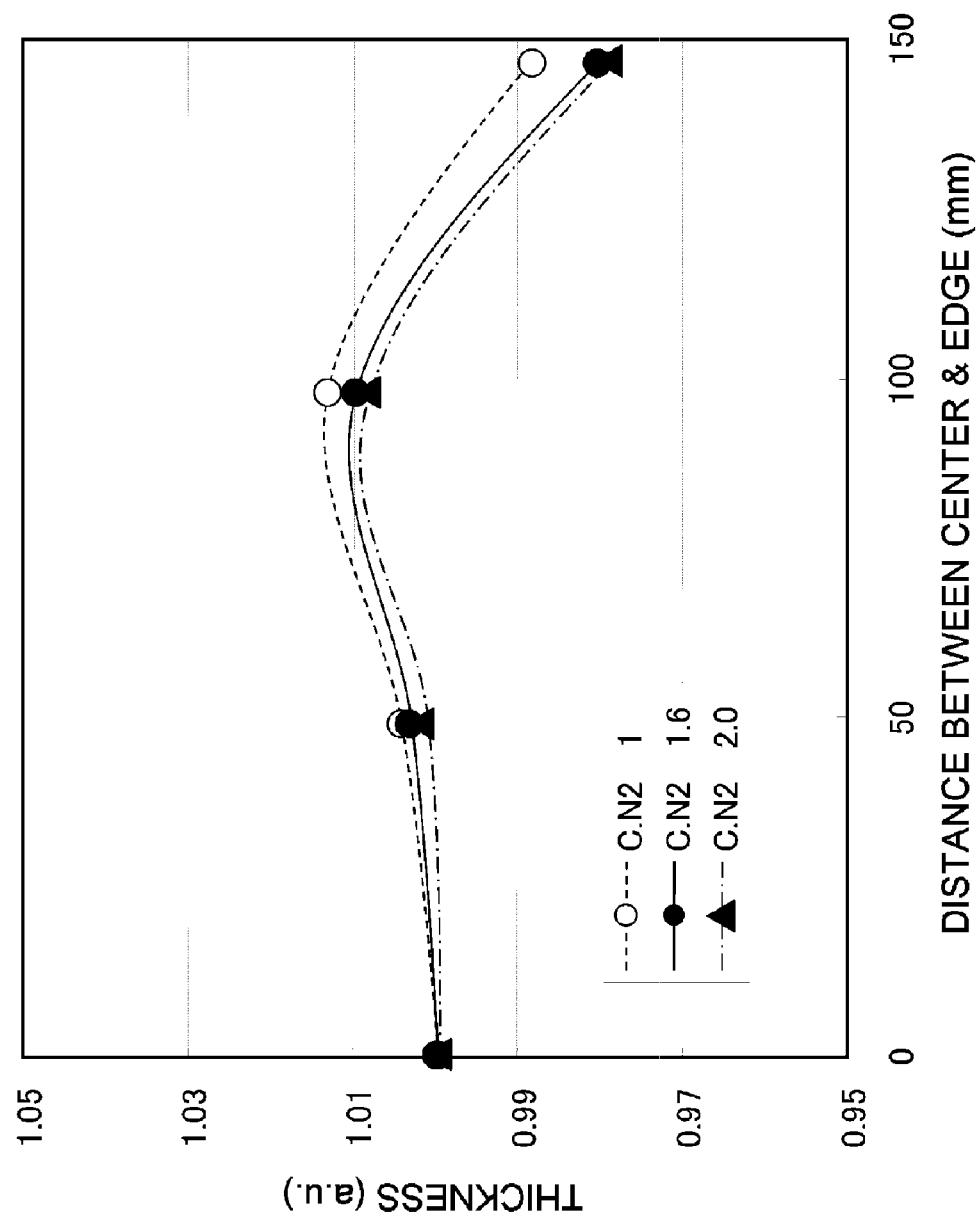
FIG. 7 is a view illustrating the dependence of the thickness of a silicon oxide film on the distance from the center of a wafer for different flow rates of a deposition/adsorption inhibition gas ($N_2$).

FIG. 7 is a view illustrating the dependence of the thickness of a silicon oxide film on the distance from the center of a wafer for different flow rates of a deposition/adsorption inhibition gas ($N_2$). In FIG. 7, the horizontal axis denotes the distance (mm) from the center of the wafer in a surface of the wafer. That is, the horizontal axis denotes positions in a direction (radial direction) from the center to the edge of the wafer. In the horizontal axis, 0 mm denotes the center of the wafer, and 150 mm denotes the edge of the wafer. In FIG. 7, the vertical axis denotes the thickness of the silicon oxide film. The thickness of the silicon oxide film is shown based on the thickness of the film at the center of the wafer. That is, it is shown as a ratio by setting the thickness at the center of the wafer to 1. In FIG. 7, white circles (○), black dots (●), and black triangles (▲) denote film thicknesses when the flow rate of deposition/adsorption inhibition gas ($N_2$ gas) was set to flow rate condition (A), flow rate condition (B), and flow rate condition (C), respectively.

Referring to FIG. 7, as the supply flow rate of $N_2$ gas used as a deposition/adsorption inhibition gas is increased, the film thickness decreases at the edge part of the wafer, and the thicker part of the film is moved toward the center of the wafer. In addition, the thickness difference between the thickest part and the thinnest part of the silicon oxide film is reduced. That is, as the supply flow rate of $N_2$ gas is increased, the deposition center of silicon or the adsorption center of HCD gas can be moved closer to the center of the wafer from an edge side of the wafer, and thus a silicon-containing layer can be uniformly formed. As a result, a silicon oxide film can be uniformly formed.

Figure 8:
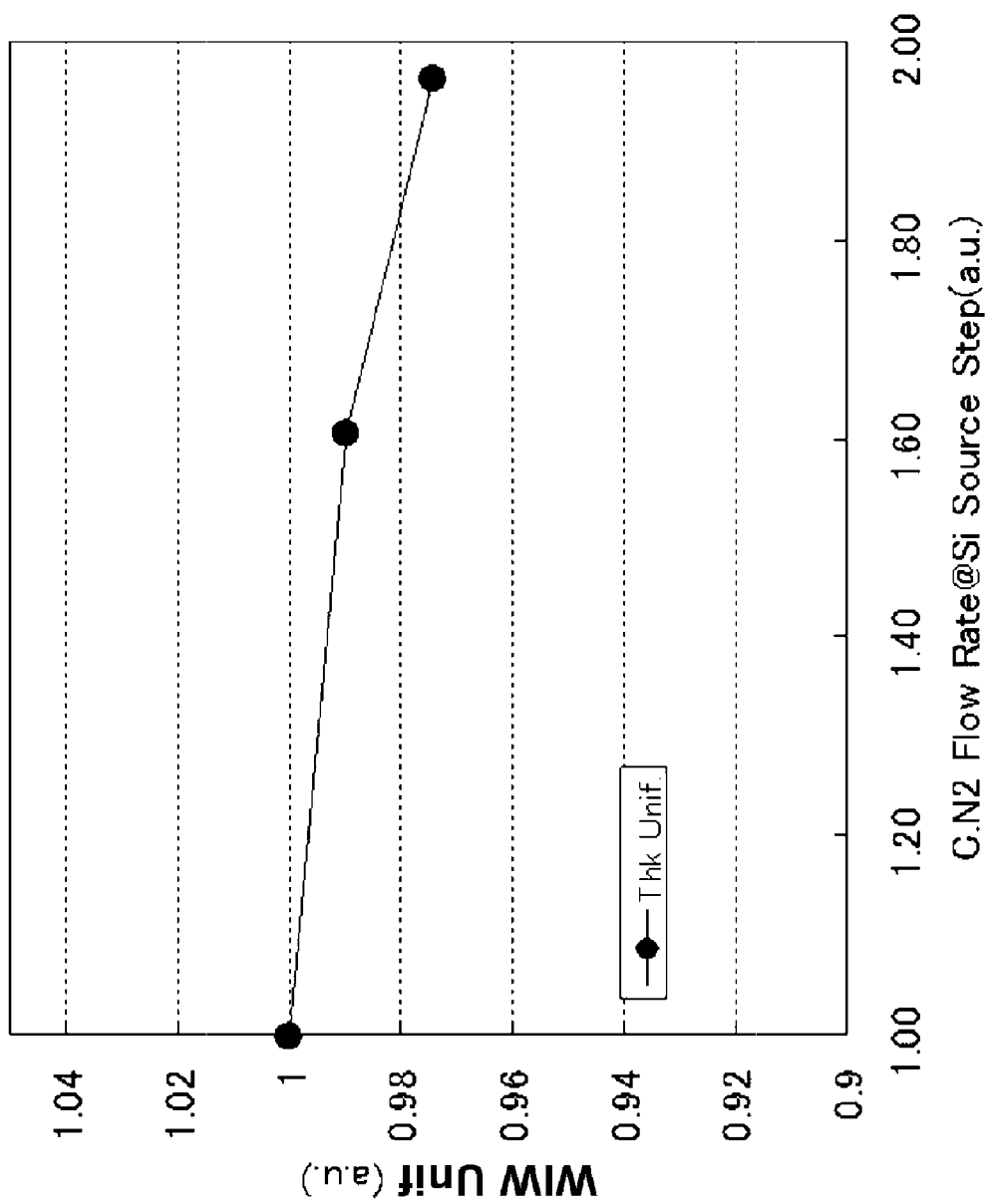
FIG. 8 is a view illustrating the dependence of within-wafer thickness uniformity of a silicon oxide film on the supply flow rate of a deposition/adsorption inhibition gas ($N_2$).

FIG. 8 is a view illustrating the dependence of within-wafer thickness uniformity of a silicon oxide film on the supply flow rate of deposition/adsorption inhibition gas ($N_2$). In FIG. 8, the horizontal axis denotes the supply flow rate of deposition/adsorption inhibition gas ($N_2$). The supply flow rate of $N_2$ gas is shown as a ratio based on the minimum supply flow rate of the three supply flow rates, that is, by setting the minimum supply flow rate to 1. In FIG. 8, the vertical axis denotes within-wafer thickness uniformity (arbitrary unit). The within-wafer thickness uniformity is shown based on the within-wafer thickness uniformity when the supply flow rate of deposition/adsorption inhibition gas ($N_2$ gas) is set to the flow rate condition (A), that is, by setting the within-wafer thickness uniformity at the flow rate condition (A) to 1. In FIG. 8, black dots (●) denote the within-wafer thickness uniformity when the supply flow rate of deposition/adsorption inhibition gas ($N_2$ gas) is set to the flow rate condition (A), the flow rate condition (B), and the flow rate condition (C) from the left side. The within-wafer thickness uniformity denotes the degree of variations of film thickness distribution in a surface of a wafer, and a lower value of the within-wafer thickness uniformity denotes better within-wafer thickness uniformity.

As shown in FIG. 8, as the supply flow rate of $N_2$ gas used as a deposition/adsorption inhibition gas is increased, the within-wafer thickness uniformity can be improved. The following fact was found. Even when the supply flow rate of deposition/adsorption inhibition gas ($N_2$ gas) was set to any of the flow rate condition (A), the flow rate condition (B), and the flow rate condition (C), the within-wafer thickness uniformity was about 1.9% or lower. Furthermore, even in a high temperature region of 700° C. to 800° C. where the film thickness uniformity was noticeably deteriorated in the first example, a silicon oxide film having very good within-wafer thickness uniformity could be formed.

Third Example

Next, a third example will be described.

A non-plasma oxidizing treatment in step 3 of the film-forming sequence of the current embodiment (hereinafter referred to as $O_2+H_2$ addition oxidizing treatment) was compared with an oxidizing treatment using plasma (hereinafter referred to as $O_2+H_2$ addition plasma oxidizing treatment), an $O_2$ plasma oxidizing treatment, an $O_3$ oxidizing treatment, and an $O_2$ oxidizing treatment to compare oxidizing power. The $O_2+H_2$ addition plasma oxidizing treatment means the case where $O_2$ in which $H_2$ was added (a mixture gas of $O_2$ and $H_2$) was activated by plasma and an oxidizing treatment was performed using the activated mixture gas. Oxidizing power was measured based on the oxidized amount with respect to silicon. That is, oxidizing power was measured based on the thickness of a silicon oxide film formed by oxidizing treatment with respect to silicon. The oxidizing treatment temperature (wafer temperature) was varied in the range of 30° C. to 600° C. Other oxidizing treatment conditions were set in the oxidizing treatment condition ranges of the step 3 of the above-described embodiment.

Figure 9:
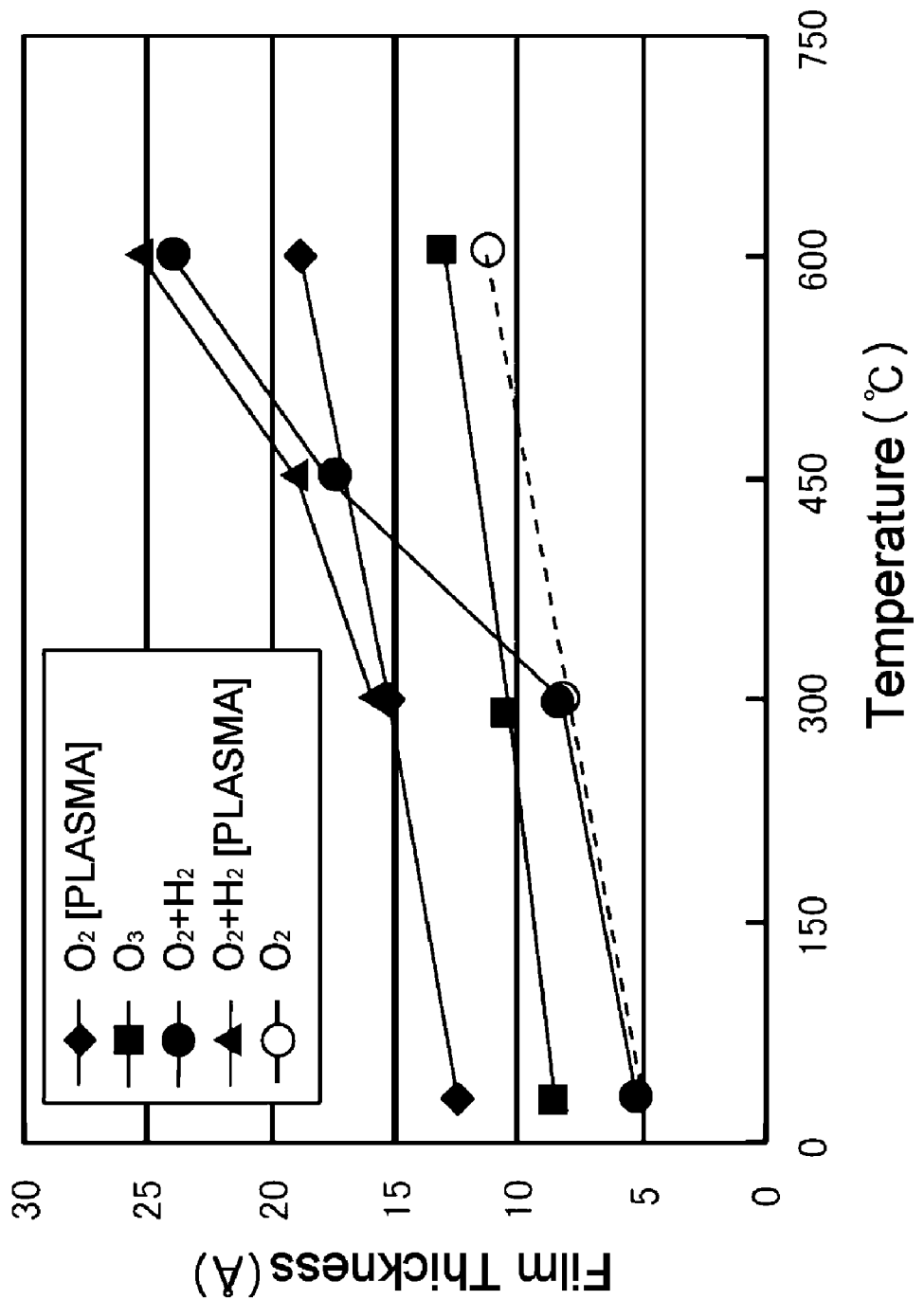
FIG. 9 is a view illustrating a relationship between the thicknesses of a silicon oxide film and wafer temperature for different oxidation-treatment gases.

The results are shown in FIG. 9. FIG. 9 illustrates a relationship between the thickness of a silicon oxide film and film-forming temperature (wafer temperature). In FIG. 9, the horizontal axis denotes film-forming temperature (° C.), and the vertical axis denotes the thickness (Å) of the silicon oxide film. In FIG. 9, black dots (●) denote an oxidized amount by the $O_2+H_2$ addition oxidizing treatment, and black triangles (▲) denote an oxidized amount by the $O_2+H_2$ addition plasma oxidizing treatment. In addition, black rhombuses (◆), black rectangles (■), and white circles (○) denote an oxidized amount by the $O_2$ plasma oxidizing treatment, an oxidized amount by the $O_3$ oxidizing treatment, and an oxidized amount by the $O_2$ oxidizing treatment, respectively.

As shown in FIG. 9, in the temperature range equal to or lower than 300° C., the oxidized amount by the $O_2+H_2$ addition oxidizing treatment is smaller than the oxidized amount by the $O_2$ plasma oxidizing treatment or the oxidized amount by the $O_3$ oxidizing treatment, and is similar to the oxidized amount by the $O_2$ oxidizing treatment performed using only $O_2$. However, in the temperature range greater than 300° C., particularly in the temperature range equal to or greater than 350° C., the oxidized amount by the $O_2+H_2$ addition oxidizing treatment is greater than the oxidized amount by the $O_2$ oxidizing treatment performed using only $O_2$. Furthermore, in the temperature range equal to greater than 400° C., the oxidized amount by the $O_2+H_2$ addition oxidizing treatment is greater than the oxidized amount by the $O_3$ oxidizing treatment. Furthermore, in the temperature range equal to lower than 450° C., the oxidized amount by the $O_2+H_2$ addition oxidizing treatment is greater than the oxidized amount by the $O_3$ oxidizing treatment and the oxidized amount by the $O_2$ plasma oxidizing treatment.

Therefore, when it is considered in terms of oxidizing power of the $O_2+H_2$ addition oxidizing treatment, it is preferable that the film-forming temperature (wafer temperature) of the film-forming sequence of the current embodiment is 300° C. or higher, more preferably, 350° C. or higher. In addition, to increase oxidizing power much more, it is preferable that the film-forming temperature is 400° C. or higher, more preferably, 450° C. or higher. Furthermore, in the temperature range of 450° C. or higher, the $O_2+H_2$ addition oxidizing treatment results in oxidizing power greater than the oxidizing power of the $O_3$ oxidizing treatment and the oxidizing power of the $O_2$ plasma oxidizing treatment. Furthermore, in the temperature range including 650° C., 700° C., 800° C., and 950° C., the $O_2+H_2$ addition oxidizing treatment results in oxidizing power greater than the oxidizing power of the $O_3$ oxidizing treatment and the oxidizing power of the $O_2$ plasma oxidizing treatment.

It is considered that strong oxidizing power is obtained in the temperature range higher than 300° C. owing to moisture ($H_2O$) generated by reaction between $O_2$ and $H_2$, high-energy oxygen generated by the reaction, and diffusion of oxygen ions ($O_2^-$) facilitated by hydrogen ions ($H^+$) diffusing in the silicon oxide film at a high speed. The bonding energy of a water molecule (H—O—H) is greater than the bonding energy of an oxygen molecule (O—O) and the bonding energy of a hydrogen molecule (H—H). This means that water molecules formed by bonding of oxygen atoms and hydrogen atoms are more stable than oxygen molecules formed by bonding of oxygen atoms. In addition, when in-furnace pressure characteristics are considered, it is obvious that $O_2$ and $H_2$ react with other to form water. Therefore, oxidizing power may be increased by adding $H_2$ to $O_2$.

Furthermore, in the temperature range equal to or lower than 300° C., the oxidized amount by the $O_2+H_2$ addition plasma oxidizing treatment is greater than the oxidized amount by the oxidized amount by the $O_2+H_2$ addition oxidizing treatment, the oxidized amount by the $O_3$ oxidizing treatment, and the oxidized amount by the $O_2$ plasma oxidizing treatment. That is, the oxidized amount by the $O_2+H_2$ addition plasma oxidizing treatment is greatest. That is, oxidizing treatment in step 3 of the film-forming sequence of the current embodiment may be effective for the case of using plasma. Furthermore, at temperatures of 650° C., 700° C., 800° C., and 950° C., the oxidizing power of the $O_2+H_2$ addition plasma oxidizing treatment is greater than the oxidizing power of the $O_2+H_2$ addition oxidizing treatment, the oxidizing power of the $O_3$ oxidizing treatment, and the oxidizing power of the $O_2$ plasma oxidizing treatment. As well as performing an oxidizing treatment by adding $H_2$ to $O_2$ and activating the mixture by plasma, an oxidizing treatment may be performed by adding $H_2$ to $O_2$ plasma, or by adding $H_2$ plasma to $O_2$. That is, an oxidizing treatment may be performed by activating one or both of $O_2$ and $H_2$ by plasma. In this cases, the same effects as those in $O_2+H_2$ addition plasma oxidizing treatment can be obtained.

As described above, the present invention provides a method of manufacturing a semiconductor device, a method of process a substrate, and a substrate processing apparatus, which are designed to form an insulating film having good thickness uniformity and very low impurity concentrations in a high temperature region.

The present invention also includes the following preferred embodiments.

According to an embodiment of the present invention, there is provided a method of manufacturing a semiconductor device, including:

(a) supplying a source gas containing a predetermined element into a process vessel accommodating a substrate and exhausting the source gas from the process vessel to form a layer containing the predetermined element on the substrate;

(b) supplying an oxygen-containing gas and a hydrogen-containing gas into the process vessel under a heated atmosphere and exhausting the oxygen-containing gas and the hydrogen-containing gas from the process vessel to change the layer containing the predetermined element into an oxide layer, wherein a pressure of an inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

Preferably, in the step (a), a flow rate of one of the inert gas and the hydrogen-containing gas supplied together with the source gas through the nozzle is greater than that of the inert gas supplied through the nozzle in the step (c).

Preferably, in the step (a), a flow rate of one of the inert gas and the hydrogen-containing gas supplied together with the source gas through the nozzle is greater than that of the source gas.

Preferably, in the step (a), a flow rate of one of the inert gas and the hydrogen-containing gas supplied together with the source gas through the nozzle is ten to thirty times greater than that of the source gas.

Preferably, the flow rates may be volumetric flow rates.

Preferably, in the step (a), the layer containing the predetermined element is formed while suppressing at least one of a deposition and an adsorption of the layer containing the predetermined element by an action of one of the inert gas and the hydrogen-containing gas supplied together with the source gas through the nozzle.

Preferably, in the step (d), a temperature of the substrate ranges from 350° C. to 950° C.

Preferably, in the step (d), a temperature of the substrate ranges from 700° C. to 950° C.

Preferably, in the step (d), a temperature of the substrate ranges from 700° C. to 800° C.

According to another embodiment of the present invention, there is provided a method of manufacturing a semiconductor device, including:

(a) supplying a source gas containing a silicon into a process vessel accommodating a substrate and exhausting the source gas from the process vessel to form a silicon-containing layer on the substrate;

(b) supplying an oxygen-containing gas and a hydrogen-containing gas into the process vessel under a heated atmosphere and exhausting the oxygen-containing gas and the hydrogen-containing gas from the process vessel to change the silicon-containing layer into a silicon oxide layer, wherein a pressure of an inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form a silicon oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

According to another embodiment of the present invention, there is provided a method of manufacturing a semiconductor device, including:

(a) supplying a source gas containing a predetermined element into a process vessel accommodating a substrate and exhausting the source gas from the process vessel to form a layer containing the predetermined element on the substrate;

(b) supplying an oxygen-containing gas and a hydrogen-containing gas into the process vessel under a heated atmosphere and exhausting the oxygen-containing gas and the hydrogen-containing gas from the process vessel to change the layer containing the predetermined element into an oxide layer, wherein a pressure of an inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that an injection power of the source gas injected in a direction parallel to a surface of the substrate is greater than that of the inert gas injected in the direction parallel to the surface of the substrate in the step (c).

According to another embodiment of the present invention, there is provided a method of manufacturing a semiconductor device, including:

(a) supplying a source gas containing a silicon into a process vessel accommodating a substrate and exhausting the source gas from the process vessel to form a silicon-containing layer on the substrate;

(b) supplying an oxygen-containing gas and a hydrogen-containing gas into the process vessel under a heated atmosphere and exhausting the oxygen-containing gas and the hydrogen-containing gas from the process vessel to change the silicon-containing layer into a silicon oxide layer, wherein a pressure of an inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form a silicon oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that an injection power of the source gas injected in a direction parallel to a surface of the substrate is greater than that of the inert gas injected in the direction parallel to the surface of the substrate in the step (c).

According to another embodiment of the present invention, there is provided a method of processing a substrate, including:

(a) supplying a source gas containing a predetermined element into a process vessel accommodating the substrate and exhausting the source gas from the process vessel to form a layer containing the predetermined element on the substrate;

(b) supplying an oxygen-containing gas and a hydrogen-containing gas into the process vessel under a heated atmosphere and exhausting the oxygen-containing gas and the hydrogen-containing gas from the process vessel to change the layer containing the predetermined element into an oxide layer, wherein a pressure of an inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

According to yet another embodiment of the present invention, there is provided According to another embodiment of the present invention, there is provided a method of manufacturing a semiconductor device, including:

(a) supplying a source gas containing a predetermined element into a process vessel accommodating a substrate and exhausting the source gas from the process vessel to form a layer containing the predetermined element on the substrate;

(b) supplying an oxygen-containing gas and a hydrogen-containing gas into the process vessel under a heated atmosphere and exhausting the oxygen-containing gas and the hydrogen-containing gas from the process vessel to change the layer containing the predetermined element into an oxide layer, wherein a pressure of an inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that an injection power of the source gas injected in a direction parallel to a surface of the substrate is greater than that of the inert gas injected in the direction parallel to the surface of the substrate in the step (c).

According to another embodiment of the present invention, there is provided a substrate processing apparatus including:

a process vessel configured to accommodate a substrate;

a heater configured to heat an inside of the process vessel;

a source gas supply system configured to supply a source gas containing a predetermined element into the process vessel;

an oxygen-containing gas supply system configured to supply an oxygen-containing gas into the process vessel;

a hydrogen-containing gas supply system configured to supply a hydrogen-containing gas into the process vessel;

an inert gas supply system configured to supply an inert gas into the process vessel;

an exhaust system configured to exhaust the inside of the process vessel;

a pressure regulator configured to control pressure of the inside of the process vessel; and a controller configured to control the source gas supply system, the oxygen-containing gas supply system, the hydrogen-containing gas supply system, the inert gas supply system, the exhaust system, the pressure regulator, and the heater so as to perform:

(a) supplying the source gas into the process vessel accommodating a substrate and exhausting the source gas from the process vessel to form a layer containing the predetermined element on the substrate;

(b) supplying the oxygen-containing gas and the hydrogen-containing gas into the process vessel under a heated atmosphere and exhausting the oxygen-containing gas and the hydrogen-containing gas from the process vessel to change the layer containing the predetermined element into an oxide layer, wherein a pressure of the inside of the process vessel is lower than an atmospheric pressure;

(c) supplying the inert gas into the process vessel and exhausting the inert gas from the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

According to another embodiment of the present invention, there is provided a substrate processing apparatus including:

a process vessel configured to accommodate a substrate;

a heater configured to heat an inside of the process vessel;

a source gas supply system configured to supply a source gas containing a predetermined element into the process vessel;

an oxygen-containing gas supply system configured to supply an oxygen-containing gas into the process vessel;

a hydrogen-containing gas supply system configured to supply a hydrogen-containing gas into the process vessel;

an inert gas supply system configured to supply an inert gas into the process vessel;

an exhaust system configured to exhaust the inside of the process vessel;

a pressure regulator configured to control pressure of the inside of the process vessel; and a controller configured to control the source gas supply system, the oxygen-containing gas supply system, the hydrogen-containing gas supply system, the inert gas supply system, the exhaust system, the pressure regulator, and the heater so as to perform:

(a) supplying the source gas into the process vessel accommodating a substrate and exhausting the source gas from the process vessel to form a layer containing the predetermined element on the substrate;

(b) supplying the oxygen-containing gas and the hydrogen-containing gas into the process vessel under a heated atmosphere and exhausting the oxygen-containing gas and the hydrogen-containing gas from the process vessel to change the layer containing the predetermined element into an oxide layer, wherein a pressure of the inside of the process vessel is lower than an atmospheric pressure;

(c) supplying an inert gas into the process vessel and exhausting the inert gas from the process vessel to purge the inside of the process vessel; and (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that an injection power of the source gas injected in a direction parallel to a surface of the substrate is greater than that of the inert gas injected in the direction parallel to the surface of the substrate in the step (c).

What is claimed is:

1. A method of manufacturing a semiconductor device, comprising:
   (a) supplying a source gas containing a predetermined element to a heated substrate in a process vessel to form a layer containing the predetermined element on the substrate;
   (b) supplying an oxygen-containing gas and a hydrogen-containing gas to the heated substrate in the process vessel to change the layer containing the predetermined element into an oxide layer, wherein a pressure of an inside of the process vessel is lower than an atmospheric pressure;
   (c) supplying an inert gas into the process vessel to purge the inside of the process vessel; and
   (d) alternately repeating the step (a) and the step (b) to form an oxide film having a predetermined thickness wherein the step (c) is performed between the step (a) and the step (b);
   wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

2. The method of claim 1, wherein, in the step (a), the source gas supplied into the process vessel under a condition where a CVD reaction is caused.

3. The method of claim 2, wherein the layer containing the predetermined element having no more than several atomic layers is formed in the step (a).

4. The method of claim 1, wherein, in the step (a), the source gas supplied into the process vessel under a condition where a self-decomposition of the source gas is caused.

5. The method of claim 4, wherein the layer containing the predetermined element having no more than several atomic layers is formed in the step (a).

6. The method of claim 1, wherein, in the step (b), an oxidizing species is generated by a reaction between the oxygen-containing gas and the hydrogen-containing gas in the process vessel at a pressure lower than atmospheric pressure and the layer containing the predetermined element is oxidized into the oxide layer by the oxidizing species.

7. The method of claim 6, wherein the oxidizing species comprises an atomic oxygen.

8. The method of claim 1, wherein, in the step (a), a flow rate of one of the inert gas and the hydrogen-containing gas supplied together with the source gas through the nozzle is greater than that of the inert gas supplied through the nozzle in the step (c).

9. The method of claim 1, wherein, in the step (a), a flow rate of one of the inert gas and the hydrogen-containing gas supplied together with the source gas through the nozzle is greater than that of the source gas.

10. The method of claim 1, wherein, in the step (a), a flow rate of one of the inert gas and the hydrogen-containing gas supplied together with the source gas through the nozzle is ten to thirty times greater than that of the source gas.

11. The method of claim 1, wherein, in the step (a), the layer containing the predetermined element is formed while suppressing at least one of a deposition and an adsorption of the layer containing the predetermined element by an action of one of the inert gas and the hydrogen-containing gas supplied together with the source gas through the nozzle.

12. The method of claim 1, wherein, in the step (d), a temperature of the substrate ranges from 350° C. to 950° C.

13. The method of claim 1, wherein, in the step (d), a temperature of the substrate ranges from 700° C. to 950° C.

14. The method of claim 1, wherein, in the step (d), a temperature of the substrate ranges from 700° C. to 800° C.

15. A method of processing a substrate, comprising:
   (a) supplying a source gas containing a predetermined element to a heated substrate in a process vessel to form a layer containing the predetermined element on the substrate;
   (b) supplying an oxygen-containing gas and a hydrogen-containing gas to the heated substrate in the process vessel to change the layer containing the predetermined element into an oxide layer, wherein a pressure of an inside of the process vessel is lower than an atmospheric pressure;
   (c) supplying an inert gas into the process vessel to purge the inside of the process vessel; and
   (d) alternately repeating the step (a) and the step (b) to form an oxide film having a predetermined thickness wherein the step (c) is performed between the step (a) and the step (b);
   wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

16. A substrate processing apparatus comprising:
   a process vessel configured to accommodate a substrate;
   a heater configured to heat a substrate in the process vessel;
   a source gas supply system configured to supply a source gas containing a predetermined element into the process vessel;
   an oxygen-containing gas supply system configured to supply an oxygen-containing gas into the process vessel;
   a hydrogen-containing gas supply system configured to supply a hydrogen-containing gas into the process vessel;
   an inert gas supply system configured to supply an inert gas into the process vessel;
   a pressure regulator configured to control pressure of the inside of the process vessel; and
   a controller configured to control the source gas supply system, the oxygen-containing gas supply system, the hydrogen-containing gas supply system, the inert gas supply system, the pressure regulator, and the heater so as to perform:
   (a) supplying the source gas to a heated substrate in the process vessel to form a layer containing the predetermined element on the substrate;
   (b) supplying the oxygen-containing gas and the hydrogen-containing gas to the heated substrate in the process vessel to change the layer containing the predetermined element into an oxide layer wherein a pressure of an inside of the process vessel is lower than an atmospheric pressure;
   (c) supplying the inert gas into the process vessel to purge the inside of the process vessel; and
   (d) alternately repeating the step (a) and the step (b) to form an oxide film having a predetermined thickness wherein the step (c) is performed between the step (a) and the step (b);

wherein, in the step (a), the source gas is supplied toward the substrate through a nozzle disposed at a side of the substrate, and one of the inert gas and the hydrogen-containing gas is supplied together with the source gas through the nozzle toward the substrate such that a flow velocity of the source gas flowing parallel to a surface of the substrate is greater than a flow velocity of the inert gas flowing parallel to the surface of the substrate in the step (c).

* * * * *